(12) United States Patent
Lovchinsky et al.

(10) Patent No.: US 10,895,617 B2
(45) Date of Patent: Jan. 19, 2021

(54) NANOSCALE NUCLEAR QUADRUPOLE RESONANCE SPECTROSCOPY

(71) Applicant: President and Fellows of Harvard College, Cambridge, MA (US)

(72) Inventors: Igor Lovchinsky, Cambridge, MA (US); Javier Sanchez, Cambridge, MA (US); Elana K. Urbach, Cambridge, MA (US); Soonwon Choi, El Cerrito, CA (US); Trond Andersen, Boston, MA (US); Philip Kim, Cambridge, MA (US); Hongkun Park, Lexington, MA (US); Mikhail D. Lukin, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 16/304,362

(22) PCT Filed: May 24, 2017

(86) PCT No.: PCT/US2017/034325
§ 371 (c)(1),
(2) Date: Nov. 26, 2018

(87) PCT Pub. No.: WO2018/026424
PCT Pub. Date: Feb. 8, 2018

(65) Prior Publication Data
US 2020/0225302 A1 Jul. 16, 2020

Related U.S. Application Data

(60) Provisional application No. 62/443,224, filed on Jan. 6, 2017, provisional application No. 62/340,794, filed on May 24, 2016.

(51) Int. Cl.
*G01R 33/44* (2006.01)
*G01N 24/08* (2006.01)
(Continued)

(52) U.S. Cl.
CPC .......... *G01R 33/441* (2013.01); *G01N 24/08* (2013.01); *G01R 33/032* (2013.01); *G01R 33/1284* (2013.01)

(58) Field of Classification Search
CPC .... G01R 33/032; G01R 33/323; G01R 33/26; G01R 33/28; G01R 33/1284; G01R 33/00;
(Continued)

(56) References Cited

U.S. PATENT DOCUMENTS 9,222,887 B2 * 12/2015 Englund .......... G01N 33/48728
9,766,181 B2 * 9/2017 Englund ............ G01N 21/6458
(Continued)

OTHER PUBLICATIONS

Aiello et al., "Time-optimal control by a quantum actuator," Physical Review A, Apr. 2015, vol. 91, pp. 042340-1 to 042340-8.
(Continued)

*Primary Examiner* — Vinh P Nguyen
(74) *Attorney, Agent, or Firm* — Wilmer Cutler Pickering Hale and Dorr LLP

(57) ABSTRACT

A method for probing the properties of nanoscale materials, such as 2D materials or proteins, via nanometer-scale nuclear quadrupole resonance (NQR) spectroscopy using individual atom-like impurities in diamond. Coherent manipulation of shallow nitrogen-vacancy (NV) color centers enables the probing of the NQR spectrum of nanoscale ensembles of nuclear spins. Measuring the NQR spectrum at different magnetic field orientations and magnitudes and
(Continued)

fitting to a theoretical model allows for the extraction of atomic structural properties of the material with nanoscale resolution.

20 Claims, 13 Drawing Sheets

(51) Int. Cl.
G01R 33/032 (2006.01)
G01R 33/12 (2006.01)

(58) Field of Classification Search
CPC ............... G01R 15/24; G01R 19/0092; G01R 29/0885; G01R 33/0029; G01R 33/02; G01R 33/0286; G01R 33/24; G01R 33/307; G01R 33/4625; G01R 31/302; G01R 31/308; G01R 33/0017; G01R 33/0094; G01R 33/282; G01R 33/3607; G01R 33/3678; G01R 33/441; G01N 24/10; G01N 21/6489; G01N 21/6458; G01N 21/6428; G01N 21/64; G01N 21/6486; G01N 24/081; G01N 21/6402; G01N 2021/6495; G01N 2201/10; G01N 24/006; G01N 24/088; G01N 24/08; G01N 33/487; G01N 33/54306; G01N 33/54386; G01N 24/084; G01N 24/087; G01N 33/54346; G01N 33/54366; G01N 33/551; G01N 33/582; G01N 2021/646; G01N 21/63; G01N 21/66; G01Q 70/14; G01Q 60/52; G16B 5/00; H01L 29/66984
See application file for complete search history.

(56) References Cited

U.S. PATENT DOCUMENTS

| | | | |
|---|---|---|---|
| 9,891,297 B2* | 2/2018 | Sushkov | G01N 24/12 |
| 10,184,994 B2* | 1/2019 | Teklemariam | G01R 33/60 |
| 2010/0308813 A1 | 12/2010 | Lukin et al. | |
| 2014/0191139 A1 | 7/2014 | Englund | |
| 2015/0001422 A1 | 1/2015 | Englund et al. | |

OTHER PUBLICATIONS

Bastow et al., "14N NMR in AlN and BN," Solid State Nuclear Magnetic Resonance, Feb. 1998, vol. 10, pp. 241-245.
Blaha et al., "First-principles calculation of the electric-field gradient in hcp metals," Physical Review B, Feb. 15, 1988, vol. 37, No. 6, pp. 2792-2796.
Boneschanscher et al., "Long-range orientation and atomic attachment of nanocrystals in 2D honeycomb superlattices," Science, Jun. 20, 2014, vol. 344, pp. 1377-1380.
Britton et al., "Engineered two-dimensional Ising interactions in a trapped-ion quantum simulator with hundreds of spins," Nature, Apr. 26, 2012, vol. 484, pp. 489-492.
Brummer et al., "Crystal structure and nuclear quadrupole resonance. The bond length C—Cl and 35Cl NQR," Ber. Bunsenges. Phys. Chem., Apr. 1990, vol. 94, Issue 4, pp. 497-513.
Cai et al., "A large-scale quantum simulator on a diamond surface at room temperature," Nature Physics, Mar. 2013, vol. 9, pp. 168-173.
Chhowalla et al., "Two-dimensional transition metal dichalcogenide (TMD) nanosheets," Chemical Society Reviews, Apr. 17, 2015, vol. 44, pp. 2584-2586.
Cywinski et al., "How to enhance dephasing time in superconducting qubits," Physical Review B, May 13, 2008, vol. 77, pp. 174509-1 to 174509-11.

Das et al. "Nuclear Quadrupole Resonance Spectroscopy (Solid State Physics Advances in Research Applications)," Academic Press Publishers, (New York, USA), Mar. 1958. Entire book, 233 pages.
De Lange et al., "Single-spin magnetometry with multipulse sensing sequences," Physical Review Letters, published Feb. 24, 2011, vol. 106, pp. 080802-1 to 080802-4.
DeVience et al., "Nanoscale NMR spectroscopy and imaging of multiple nuclear species," Nature Nanotechnology, Feb. 2015, vol. 10, pp. 129-134, erratum.
Dewhurst et al., The Elk Code, created 2003, 189 pages. (http://elk.sourceforge.net/).
Doherty et al., "The nitrogen-vacancy colour centre in diamond," Physics Reports, published online Mar. 4, 2013, vol. 528, pp. 1-45.
Dufek et al., "Determination of the nuclear quadrupole moment of 57Fe," Physical Review Letters, Nov. 6, 1995, vol. 75, No. 19, pp. 3545-3548.
Geim et al., "Van der Waals heterostructures," Nature, Jul. 25, 2013, vol. 499, pp. 419-425.
Glover et al., "Limits to magnetic resonance microscopy," Reports on Progress in Physics, Aug. 30, 2002, vol. 65, No. 10, pp. 1489-1511.
Goldman, et al., "State-selective intersystem crossing in nitrogen-vacancy centers," Physical Review B, Apr. 8, 2015, vol. 91, pp. 165201-1 to 165201-11.
Gorbachev et al., "Hunting for monolayer boron nitride: Optical and Raman signatures," Small, published online Jan. 7, 2011, vol. 7, No. 4, pp. 465-468.
Haigh et al., "Cross-sectional imaging of individual layers and buried interfaces of graphene-based heterostructures and superlattices," Nature Materials, Sep. 2012, vol. 11, pp. 764-767.
International Search Report and Written Opinion dated Feb. 13, 2018, in the International Application No. PCT/US17/34325, 14 pages.
Jarmola et al., "Temperature- and Magnetic-Field-Dependent Longitudinal Spin Relaxation in Nitrogen-Vacancy Ensembles in Diamond," Physical Review Letters, May 11, 2012, vol. 108, pp. 197601-1 to 197601-5.
Klar et al., "Sub-Abbe resolution: from STED microscopy to STED lithography," Physica Scripta, Sep. 19, 2014, article 014049, 11 pages.
Kolkowitz et al., "Sensing distant nuclear spins with a single electron spin," Physical Review Letters, Sep. 25, 2012, vol. 109, pp. 137601-1 to 137601-5.
Li et al., "Probing symmetry properties of few-layer MoS2 and h-BN by optical second-harmonic generation," Nano Letters, May 29, 2013, vol. 13, pp. 3329-3333.
London et al., "Detecting and polarizing nuclear spins with double resonance on a single electron spin," Physical Review Letters, Aug. 5, 2013, vol. 111, pp. 067601-1 to 067601-5.
Loretz et al., "Nanoscale nuclear magnetic resonance with a 1.9-nm-deep nitrogen-vacancy sensor," Applied Physics Letters, published online Jan. 21, 2014, vol. 104, pp. 033102-1 to 033102-5.
Lovchinsky et al., "Nuclear magnetic resonance detection and spectroscopy of single proteins using quantum logic," Science, Feb. 19, 2016, vol. 351, Issue 6275, pp. 836-841.
Maletinsky et al., "A robust scanning diamond sensor for nanoscale imaging with single nitrogen-vacancy centres," Nature Nanotechnology, Apr. 15, 2012, vol. 7, pp. 320-324.
Mamin et al., "Nanoscale Nuclear Magnetic Resonance with a Nitrogen-Vacancy Spin Sensor," Science, Feb. 1, 2013, vol. 339, Issue 6119, pp. 557-560.
Maurer et al., "Room-Temperature Quantum Bit Memory Exceeding One Second," Science, Jun. 8, 2012, vol. 336, pp. 1283-1286.
Maze et al., "Nanoscale magnetic sensing with an individual electronic spin in diamond," Nature, Oct. 2, 2008, vol. 455, pp. 644-647.
Novoselov et al., "2D materials and van der Waals heterostructures," Science, Jul. 29, 2016, vol. 353, Issue 6298, pp. aac9439-1 to aac9439-11.
Perdew et al., "Accurate and simple analytic representation of the electron-gas correlation energy," Physical Review B, Jun. 15, 1992, vol. 45, No. 23, pp. 13244-13249.

(56) References Cited

OTHER PUBLICATIONS

Pham et al., "NMR technique for determining the depth of shallow nitrogen-vacancy centers in diamond," Physical Review B, Jan. 25, 2016, vol. 93, pp. 045425-1 to 045425-12.

Romach et al., "Spectroscopy of surface-induced noise using shallow spins in diamond," Physical Review Letter, Jan. 6, 2015, vol. 114, pp. 017601-1 to 017601-5.

Shields et al., "Efficient Readout of a Single Spin State in Diamond via Spin-to-Charge Conversion," Physical Review Letters, Mar. 31, 2015, vol. 114, pp. 136402-1 to 136402-5.

Silver et al., "NMR Study of Bonding in Some Solid Boron Compounds," Journal of Chemical Physics, Jan. 1960, vol. 32, No. 1, pp. 288-292.

Staudacher et al., "Nuclear Magnetic Resonance Spectroscopy on a (5-Nanometer)3 Sample Volume," Science, Feb. 1, 2013, vol. 339, Issue 6119, pp. 561-563.

Staudacher et al., "Probing molecular dynamics at the nanoscale via an individual paramagnetic centre," Nature Communications, Oct. 12, 2015, vol. 6, No. 8527, 7 pages.

Suits, "Chapter 2. Nuclear Quadrupole Resonance Spectroscopy," Handbook of Applied Solid State Spectroscopy, Springer, Jul. 5, 2006, pp. 65-96.

Sushkov et al., "Magnetic Resonance Detection of Individual Proton Spins Using Quantum Reporters," Physical Review Letters, Nov. 3, 2014, vol. 113, pp. 197601-1 to 197601-5.

Taniguchi et al., "Synthesis of high-purity boron nitride single crystals under high pressure by using Ba—BN solvent," Journal of Crystal Growth, available online Jan. 26, 2007, vol. 303, pp. 525-529.

Tran et al., "Quantum emission from hexagonal boron nitride monolayers," Nature Nanotechnology, Jan. 2016, vol. 11, pp. 37-41.

Wang et al., "Understanding and controlling the substrate effect on graphene electron-transfer chemistry via reactivity imprint lithography," Nature Chemistry, Sep. 2012, vol. 4, No. 9, pp. 724-732.

Watanabe et al., "Direct-bandgap properties and evidence for ultraviolet lasing of hexagonal boron nitride single crystal," Nature Materials, Jun. 2004, vol. 3, pp. 404-409.

Werner et al., "SQUID-NQR of nitrogen-14 in amino acids and small peptides," Chemical Physics Letters, Jun. 25, 1993, vol. 209, pp. 17-21.

Wolf et al., "Subpicotesla Diamond Magnetometry," Physical Review X, published online Oct. 5, 2015, vol. 5, pp. 041001-1 to 041001-10.

Zax et al., "Zero field NMR and NQR," Journal of Chemical Physics, Nov. 15, 1985, vol. 83, No. 10, pp. 4877-4905.

Zomer et al., "Fast pick up technique for high quality heterostructures of bilayer graphene and hexagonal boron nitride," Applied Physics Letters, vol. 105, published online Jul. 7, 2014, pp. 013101-1 to 013101-4.

* cited by examiner

FIG. 14
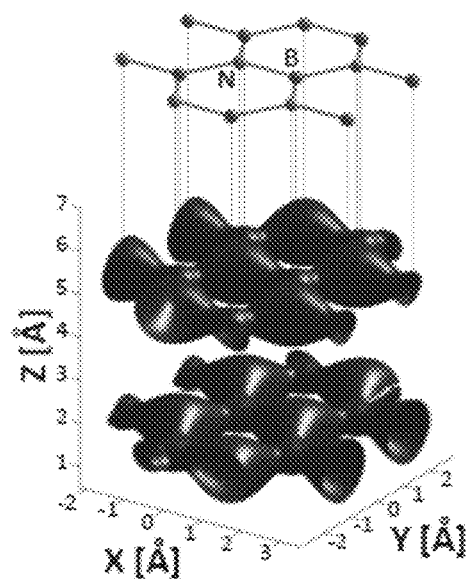
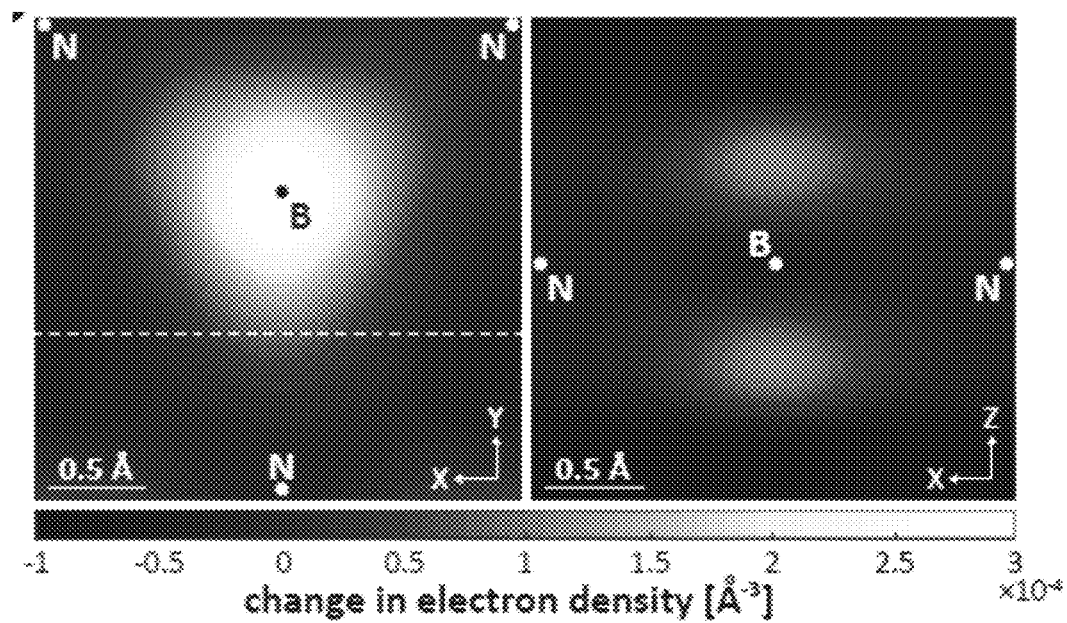
FIG. 15A        FIG. 15B

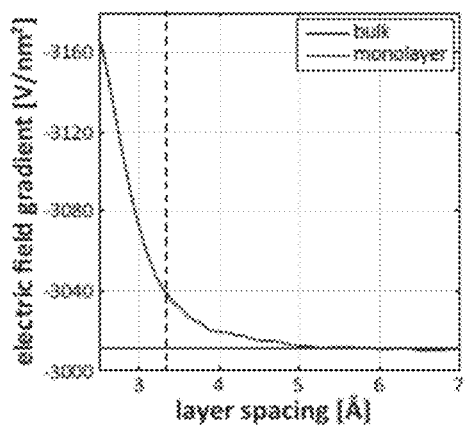 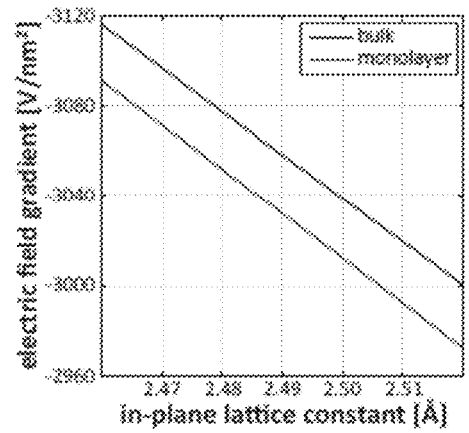
FIG. 16A          FIG. 16B
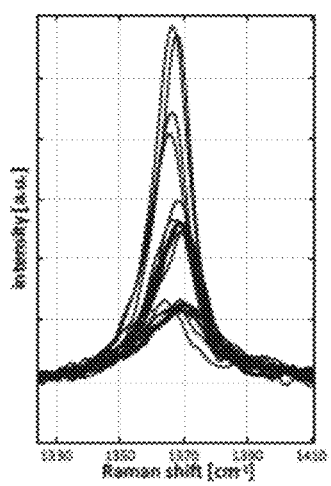 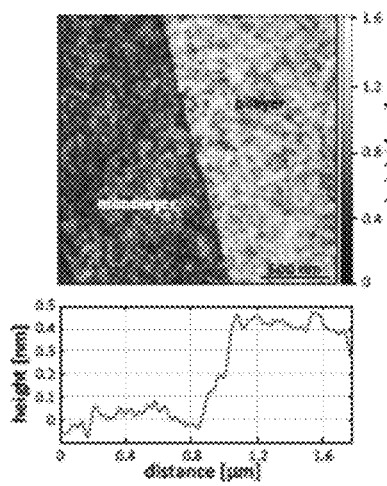 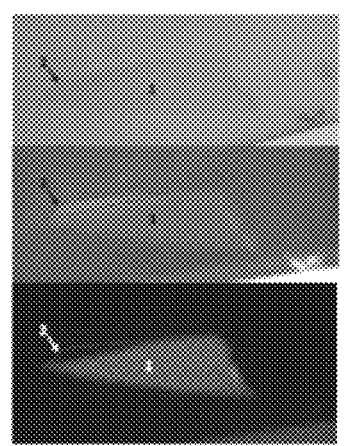
FIG. 17A          FIG. 17B          FIG. 17C

NANOSCALE NUCLEAR QUADRUPOLE RESONANCE SPECTROSCOPY

RELATED APPLICATIONS

This application is a national phase application of PCT/US2017/034325, entitled NANOSCALE NUCLEAR QUADRUPOLE RESONANCE SPECTROSCOPY, filed on May 24, 2017, which claims the benefit of priority under 35 U.S.C. § 119(c) to U.S. Provisional Application No. 62/340,794, filed May 24, 2016, and U.S. Provisional Application No. 62/443,224, filed Jan. 6, 2017, the contents of each of which are incorporated in their entirety by reference.

STATEMENT REGARDING FEDERALLY SPONSORED RESEARCH OR DEVELOPMENT

The present invention was made with United States government support under DARPA Grant No. HR0011-111-C-0073 awarded by the Office of Naval Research, and Grant No. PHY-1125846 awarded by the National Science Foundation. The United States government has certain rights in this invention.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

This technology relates generally to probing and imaging of nanoscale materials, including two-dimensional materials and biomolecules. In particular, the technology relates to methods and systems that provide information regarding the structure and orientation of these materials. Measurement is possible on nanoscale sensing volumes and can measure structural changes in a material on the nanoscale Conventional nuclear quadrupole resonance (NQR) spectroscopy is a powerful tool for chemical analysis that relies on detecting the magnetization of quadrupolar (I>½) nuclear spins in a weak magnetic field. The NQR spectrum is determined by the interaction between the nuclear electric quadrupole moments and the local electric field gradients (EFG) in a material, and is thus dependent upon the electrostatic environment of the nuclei. In the case when the target material is axially symmetric and no external magnetic field is applied, the quadrupolar interaction defines a principal axis for the nuclear spins. As illustrated in FIG. 3B for the special case of I=$\frac{3}{2}$, application of a small magnetic field yields a set of perturbed spin eigenstates with energies that depend on the orientation of the applied field with respect to the principal axis. As in nuclear magnetic resonance (NMR), NQR spectroscopy yields the transition frequencies and relaxation/decoherence rates, which in turn can be related to various material properties (e.g. chemical composition, bond lengths and angles). However, conventional magnetic resonance methods require macroscopic samples with ~$10^{17}$ spins and as such are not suitable for experiments with nanoscale sample volumes, such as atomically thin layers of 2D materials or single proteins.

Since the isolation of graphene in 2004, two-dimensional (2D) materials have found use in diverse areas of science and technology. 2D materials provide an experimental platform for studying quantum many-body phenomena and their remarkable properties enable unique applications in areas like photovoltaics, energy storage and biomedical engineering. While the electronic and optical properties of many 2D allotropes and compounds have been well-characterized, their nuclear spin properties remain largely unexplored.

Hexagonal boron nitride (h-BN) is an insulating material consisting of equal concentrations of boron (80% $^{11}$B, 20% $^{10}$B) and nitrogen (close to 100% $^{14}$N) in a honeycomb layered structure. The individual atomic layers of h-BN are held together by weak van der Waals interactions, allowing the preparation of samples with varying numbers of layers via mechanical exfoliation. Nanometer-thick h-BN flakes are being extensively used as dielectric spacers and passivation layers for graphene and transition metal dichalcogenides. Recent studies have shown that atomically thin h-BN can be the host for interesting quantum defects.

SUMMARY

A method and system for probing the nuclear spin properties of nanoscale materials is described. In one aspect, a method for probing the properties of nanoscale materials via nanometer-scale nuclear quadrupole resonance (NQR) spectroscopy is described using individual atom-like impurities in diamond (or other crystal lattices). The method includes the coherent control of individual nitrogen-vacancy (NV) color centers in diamond, which are used to perform room-temperature NQR spectroscopy on small ensembles (~10-10,000) of nuclear spins within a nanoscale volume of material. The technique is so sensitive that it can be used to detect signals from a single atomic monolayer of a material.

The technique takes advantage of the sensitivity of NQR spectroscopy to the local electric field gradients at the location of measured nuclei within a material. In this way, the nanoscale NQR spectroscopy can extract structural information about the crystal, such as its crystal orientation, crystal strain, and lattice symmetries. This is accomplished by measuring the NQR spectrum at different magnetic field orientations and magnetic field strengths and fitting the data with an atomic model which considers the competing effects of the applied magnetic field and the effects of quadrupole interactions within the material. The method can also determine structural changes at a different locations of the material with nanoscale spatial sensitivity by using multiple NV centers that are close to different parts of the material.

In one aspect, a method of characterizing nanoscale materials includes (a) providing a sample having at least one nuclear spin with a nonzero nuclear quadrupole moment in proximity to a sensor, wherein the sensor comprises at least one solid state electronic spin qubit; (b) applying a magnetic field at a first angle to the sample; (c) applying light and a plurality of external spin perturbation sequences to the sensor to coherently manipulate the spin state of the spin qubit, wherein each of the external spin perturbation sequences filters for a selected magnetic field frequency produced by the nuclear spins; and (d) detecting an output signal given by the strength of the magnetic field at each selected frequency to provide a first nuclear quadrupole resonance spectrum of the sample.

In one embodiment, the method further includes (e) applying a magnetic field at a second angle to the sample; and (f) repeating steps (c) and (d) at the second position to obtain a second nuclear quadrupole resonance spectrum of the sample, wherein fitting both the first and second nuclear quadrupole resonance spectra to a theoretical model provides orientation and/or structural information about the sample.

In either of the preceding embodiments, the method can further include (g) identifying a second shallowly planted NV center in proximity to the sample; (h) aligning the magnetic field to the second NV center; and (i) repeating steps (c) and (d) at the second NV center to obtain a third nuclear quadrupole resonance spectrum of the sample, wherein comparison of the first and third nuclear quadrupole resonance spectra provides information about structure variation across different regions of the sample.

In any of the preceding embodiments, steps (e) and (f) are repeated at multiple angles to further improve the accuracy of the theoretical fit which provides information on the structural information.

In any of the preceding embodiments, the sensor includes a defect in a high purity diamond crystal lattice, and for example, the defect comprises a nitrogen vacancy center in a diamond crystal lattice.

In any of the preceding embodiments, the at least one nuclear spin has $I \geq 1$.

In any of the preceding embodiments, the plurality of external spin perturbation sequences uses a radio frequency (RF) electromagnetic field.

In any of the preceding embodiments, the plurality of external spin perturbation sequences comprises k microwave $\pi$-pulses, where k is in the range of 1 to thousands, depending on the coherence time of the NV center.

In any of the preceding embodiments, the plurality of external spin perturbation sequences has a modulation frequency in the range of 0.1 to 10 Mhz.

In any of the preceding embodiments, detecting an output signal is accomplished by measuring spin-dependent fluorescence.

In any of the preceding embodiments, the applied magnetic field strength is selected so that the Zeeman and quadrupole interactions are of the same order of magnitude.

In any of the preceding embodiments, the applied magnetic field strength is in the range of 100-2000 Gauss.

In any of the preceding embodiments, the sample is a two-dimensional material or a biological macromolecule.

In any of the preceding embodiments, the two-dimensional material is hexagonal boron nitride or graphene.

In any of the preceding embodiments, the sample is a protein.

In any of the preceding embodiments, the sample volume includes 1-10,000 nuclear spins.

In any of the preceding embodiments, the selected magnetic field frequencies are in the range of 0.1 to 10 MHz.

In any of the preceding embodiments, the first angle of the applied magnetic field is aligned with a symmetry axis of the NV center.

In any of the preceding embodiments, the method further includes fitting the NQR spectrum to a theoretical model of the atomic structure of the sample.

In any of the preceding embodiments, a quadrupole coupling constant is determined from fitting the NQR spectrum.

In any of the preceding embodiments, the local electric field gradient is determined from fitting the NQR spectrum.

In another aspect, a system for measuring the nuclear spin interactions of a nanoscale material with nuclear quadrupole coupling includes a sensor for receiving a nanoscale sample, wherein the sensor comprises at least one solid state electronic spin qubit; a magnetic field source capable of applying a magnetic field at more than one angle; a light source; an external spin perturbation source for providing a plurality of external spin perturbation sequences to the sensor, wherein the light source and external spin perturbation source are configured to coherently manipulate the spin state of the spin qubit, wherein each of the external spin perturbation sequences filters for a selected magnetic field frequency produced by the nuclear spins; and a detector for detecting an output signal given by the strength of the magnetic field at each selected frequency to provide a first nuclear quadrupole resonance spectrum of the sample.

In any of the preceding embodiments, the sensor comprises a defect in a high purity diamond crystal lattice, and the defect comprises a nitrogen vacancy center in the diamond crystal lattice.

In any of the preceding embodiments, the selected magnetic field frequencies are in the range of 0.1 to 10 MHz.

In any of the preceding embodiments, the magnetic field source is selected to provide and applied magnetic field strength in the range of 1 to 2000 Gauss.

In any of the preceding embodiments, the applied magnetic field strength is in the range of 100-2000 Gauss.

In any of the preceding embodiments, the external spin perturbation source comprises a radio frequency (RF) electromagnetic field source.

In one aspect, coherent manipulation of shallow nitrogen-vacancy (NV) color centers enables the probing of nanoscale nuclear ensembles in atomically thin hexagonal boron nitride (h-BN), which is an example of a 2D material which could not be measured with conventional NMR techniques. The technique allows for the determination of the crystal orientation of the hBN crystal. Substantial changes in the NQR spectrum are observed in mono- and bi-layers of h-BN, signifying the modification of the electronic structure of these atomically thin samples compared to bulk.

BRIEF DESCRIPTION OF THE DRAWING

The invention is described with reference to the following figures, which are presented for the purpose of illustration only and are not intended to be limiting of the invention.

In FIG. 4B, the center transitions are degenerate (indicated by *). As a specific example, these configurations are illustrated for the case of a $^{11}B$ spin in h-BN, surrounded by its nearest five nitrogen atoms, the configuration shown above each plot.

FIG. 14 is an illustration visualizing the electron density for two layers of bulk h-BN, as calculated with DFT. A single contour, corresponding to a density of ~1° A$^3$ is shown. Boron and nitrogen sites are indicated in the schematic of atomic structure (top).

FIG. 15A is an illustration of the excess electron caps in the X/Y plane (0.8° A above the atom plane). A single unit cell is shown. The image corresponds to the difference between the monolayer and bulk electron densities.

FIG. 15B is a visualization of the excess electron caps in the X/Z plane (Y value indicated by dashed line in left panel) for a monolayer compared to the bulk. Projected positions of boron and nitrogen ions indicated.

FIGS. 16A and 16B illustrate the sensitivity of EFG to changes in lattice constants. FIG. 16A shows variations of bulk EFG as a function of inter-layer spacing. The curve approaches the monolayer value when the layers are far apart. Dashed black line indicates bulk h-BN layer spacing of 3.33 Å. FIG. 16B shows the variation of bulk EFG as a function of in-plane lattice constant.

FIGS. 17A-17C illustrate identification of monolayer and bilayer flakes of h-BN. FIG. 17A shows Raman spectroscopy of thin h-BN flakes. Intensity of the $E_{2g}$ Raman peak is proportional to the number of layers. FIG. 17B shows atomic force microscope height image (top) of the interface between a monolayer and bilayer flake showing a step height of ~0.4 nm. Bottom plot shows a cross-section of the step. FIG. 17C shows white light reflection image of the same h-BN flake (top). The monolayer and bilayer regions are labeled by numbers 1 and 2. Middle panel shows a scanning confocal laser image of same flake with excitation and collection at 440 nm. Bilayer region shows greater reflection. Bottom panel shows SHG contrast measured by exciting with 880 nm light and collecting at 440 nm. The monolayer region shows strong SHG signal due to broken inversion symmetry, while the bilayer region shows no SHG signal.

DETAILED DESCRIPTION

Figure 1:
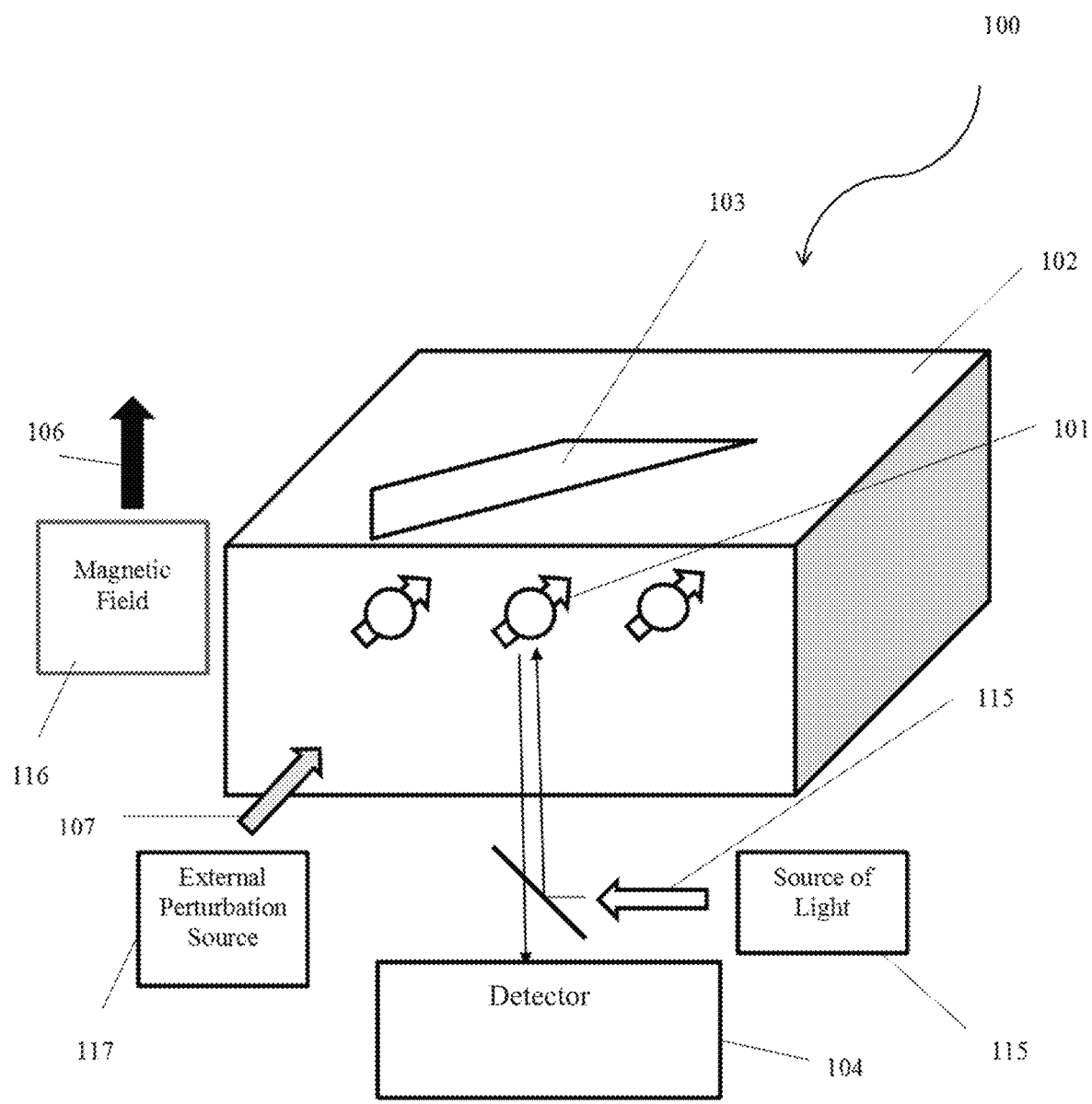
FIG. 1 is schematic illustration of a system useful in the interrogation of two-dimensional materials according to one or more embodiments.

A method and system for probing structural properties of a nanoscale material is described.

In an aspect, the device includes a sensor having at least one electronic spin quantum bit (qubit) having a spin-state dependent fluorescence. The qubit can be part of a solid state electronic spin system. The at least one electron-spin quantum bit (qubit) is located beneath the surface of the sensor but shallowly implanted, e.g., within a range of 1 nm to 100 nm, to facilitate interaction with a sample placed on or in proximity to the sensor. In one or more embodiments, the qubit is a single nitrogen vacancy (NV) center. The device additionally includes a source of light and an external perturbation, e.g. a microwave field source resonant to the NV center zero to minus one level transition, that allow the device to coherently manipulate the electronic spin of the qubit. The interaction between the spin states of the qubit and external perturbation acts as a filter function, making the qubit sensitive to a specific frequency component of the local magnetic field. The qubit records an output signal based on the intensity of the magnetic at this frequency. The system additionally includes an optical recorder to measure the fluorescence output signal from the qubit. Optical measurement of the spin-state dependent fluorescence, e.g., with a CCD camera or a photomultiplier, or a photodiode, provides information about the magnitude of the magnetic field at the specified frequency. Measurements can be obtained with nanoscale spatial resolution because the NV center can be brought within nanometers of the sample material. As discussed in detail below, when the sensor is placed in proximity to a target of interest, it can detect the magnetic field coming from the nuclei in the target of interest. The magnetic fields coming from the nuclei oscillate at a frequency given by the transition frequencies of the nuclear spin energy levels. The strength and frequency of these oscillating magnetic fields are measured by performing multiple measurements of the qubit where the qubit is manipulated to be sensitive to a different specific frequency for each measurement. The result of this measurement sequence is a spectrum, where the transition frequencies of the nuclear spin energy levels appear as intensity peaks in the spectrum. The detection is filtered to the specific frequency of the magnetic fluctuations coming from the nuclei by the external perturbation. The magnitude of the magnetic fluctuations at a specific frequency is then detected by a change in fluorescence of the electronic spin of the qubit.

The resulting spectra can provide information regarding the target of interest, such as the identity of the nuclear species in the case of traditional nuclear magnetic resonance. For materials where the nuclei have a quadrupolar moment, the frequency of the magnetic fluctuations will be affected by local electric field gradients within the material. In this case, the spectrum is referred to as a NQR spectrum and it gives structural information about the material, since the atomic structure determines the local electric field gradients. This structural information is often presented as a quadrupole coupling constant, which is the product of the nuclear quadrupole moment and the local electric field gradient. Another commonly extracted parameter is the asymmetry parameter in materials that are not axially symmetric. Information regarding the electron distribution and spin-spin interactions in the target material can be determined from the spectrum shape as well.

By generating an NQR spectrum of a sample under a first set of conditions, e.g., under a static magnetic field aligned with the NV axis of symmetry in proximity to a first coherently manipulated NV center, and comparing it to an NQR spectrum generated under a second set of conditions, e.g., by rotating or altering the magnetic field relative to the NV axis of symmetry and/or using a second coherently manipulated NV center, information regarding the orientation of the nanoscale material on the surface or changes in alignment within the nanoscale material can be obtained, for example, by fitting the spectrum to a theoretical model of the atomic structure of the nanoscale material.

In one or more embodiments, the dependence of the NQR spectrum on the orientation of the applied magnetic field (both at high and at low magnetic fields) is reported. This orientation dependence allows the determination of the orientation of the crystal, and more generally the orientation of the nuclei in the crystal.

In one or more embodiments, the quadrupole coupling constants of the nuclear spin species are measured and the electric field gradients at measured atomic sites within the crystal can be determined.

In one or more embodiment, the linewidths of nuclear spin species can be measured. The linewidth can be used to determine the relaxation rate and coherence time of the nuclei in the material of interest, which allows extraction of information about the material, e.g. the types of interactions in the system.

In one or more embodiments, the measurement of NQR spectra of boron-11, boron-10 and nitrogen-14 nuclear spins in nanoscale flakes of h-BN crystals is described.

FIG. 1 is a schematic of a system to detect NQR signals from a sample interacting with a solid state electronic spin system having at least one qubit 101 in a sensor 100, located below the surface 102 of the sensor 100. A sample 103 is attached to the surface 102 of the sensor. The schematic also shows a detector 104 used to measure the solid-state electronic spin fluorescence in response to the sample 103 light 105, an applied magnetic field 106 and an external perturbation 107 originating from the sample 103 and the source of light 115, a magnetic field source 116, and a source of an external perturbation 117, respectively.

The light 105 generated from the source of light 115, when applied to the electronic spin of the qubit 101, causes the electronic spin to align along a well-defined direction, e.g., the NV symmetry axis. In some embodiments, the source of light 115 is a laser. In an exemplary embodiment, the laser may generate light 105 that has a wavelength of about 532 nm and has green color.

The magnetic field 106 originating from the magnetic field source 116 is applied to qubit 101 and causes a detectable splitting in the electronic spin energy level, i.e., causes a detectable Zeeman shift. In one embodiment, the magnetic field is aligned, e.g., with the NV symmetry axis. In other embodiment, as is described in detail below, the magnetic field is rotated away from alignment with the spin center to provide additional information about the structure and orientation of the sample. In some embodiments, the first external perturbation source 116 is a permanent magnet, or a current-carrying coil, and the magnetic field 106 is a static magnetic field.

An external perturbation 107 originating from the external perturbation source 117 is applied to the electronic spin of qubit 101 and causes controllable flipping or rotation of the electronic spin. In some embodiments, the external perturbation 107 is a sequence of pulses of RF radiation and the external perturbation source 117 is an RF field generator. In one or more embodiments, the external perturbation is microwave frequency.

In an aspect, the sensing device and related method can provide information regarding a target material of interest. Any nucleus with more than one unpaired nuclear particle (protons or neutrons) will have a charge distribution which results in an electric quadrupole moment, which is sensitive to the local electric field gradient. The magnitude of this electric field gradient, which is created by the electron density from bonding electrons and/or surrounding ions, can be studied using the systems and methods described herein. Additionally, application of an external static magnetic field to a quadrupolar nucleus splits the quadrupole levels by coupling to the nuclear magnetic moment. The total shift of the nuclear levels depends sensitively on the relative orientation of the electric field gradient, determined by the nature and symmetry of the bonding around the nucleus, and the external magnetic field.

In one aspect, the sensor is a high purity diamond. In some embodiments, individual NV centers in diamond are used as sensitive, atomic-scale magnetic field sensors to probe nanoscale materials such as two-dimensional materials under ambient conditions. The NV spin is found as a defect in the lattice structure of a single crystal diamond. The NV is located in the lattice of carbon atoms, where two adjacent sites are altered, because one carbon atom is replaced with a nitrogen atom and the other space is left vacant. The vacancies may interact with interstitial atoms, such as nitrogen, and may act as color centers by absorbing visible light. NV spins fluoresce red light when illuminated by a laser. Formed using ion implantation within several nanometers from the diamond surface, NV centers can have sensing volumes that are many orders of magnitude smaller than most conventional magnetic sensing techniques. In some embodiments, the proximal shallowly implanted NV spin is located about 1 nm to 100 nm below the diamond surface. In some other embodiments, the NV spin is located within 2-10 nm below the diamond surface. The methods of the invention are illustrated using h-BN (hexagonal-boron nitride), however, in principle any two-dimensional material can be used, including graphene and h-BN, or more generally, any nanoscale material, such as protein.

Figure 2:
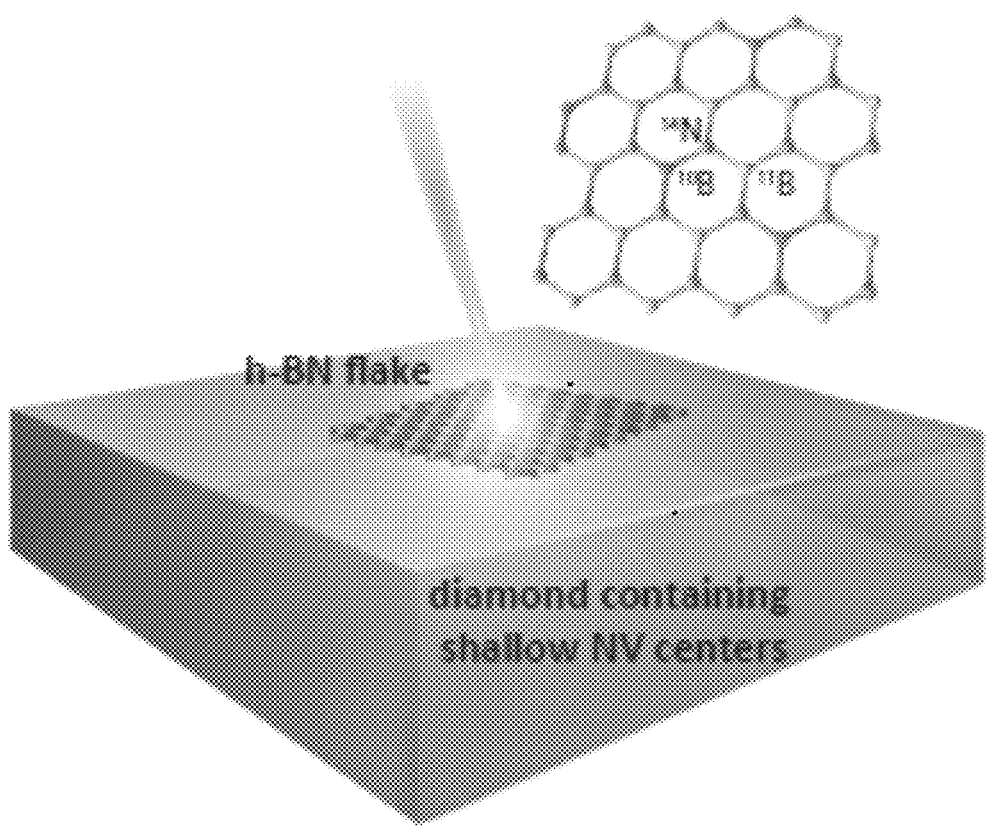
FIG. 2 is a schematic illustration of an experimental setup and sensing scheme for an exemplary system using h-BN flake (structure shown on top insert), which is transferred onto a diamond surface and a proximal shallow NV center is used to detect nuclear spins within the h-BN crystal.
Figure 3:
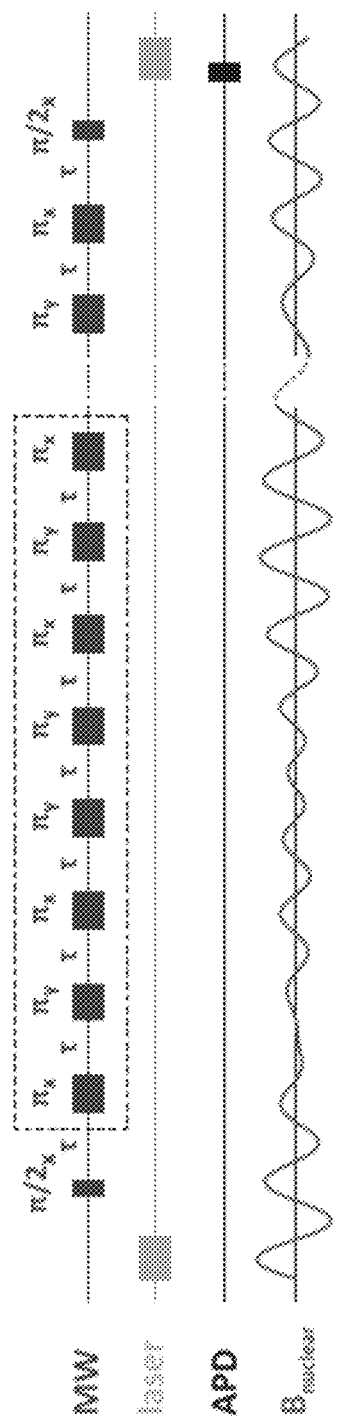
FIG. 3 is a time sequence of the modified XY8-k pulse sequence used to measure the NQR spectrum. A laser is used to irradiate NV centers and a photodiode is used to detect fluorescence; the magnetic field B created by the target nuclear spins is shown in the lower trace.

In one embodiment, a target h-BN flake is transferred onto the surface of a diamond and a proximal NV center is used to detect NQR signals from small ensembles of nuclear spins within the h-BN crystal (FIG. 2). The flake is mechanically exfoliated onto a silicon oxide wafer using scotch tape and transferred onto the diamond surface with a polymer stamp. The crystal orientation, electron density distribution and spin-spin interactions in nanoscale h-BN volumes can be determined by analyzing the magnetic fields produced by $^{11}B$, $^{10}B$ and $^{14}N$ spins using nanoscale nuclear quadrupole resonance (NQR) spectroscopy. In order to use the NV center as a nanoscale NQR spectrometer, the NV electronic spin state is prepared in a coherent superposition of the magnetic sublevels $m_s=0$ and $m_s=1$. The spin state is then periodically modulated with a series of coherent microwave (MW) pulses, applied at frequency f (not to be confused with the carrier frequency of the microwave field, which is determined by the NV zero-field splitting and the applied magnetic field, and close to ~2.87 GHz at low fields). The spin evolution during the control sequence is governed by the time-dependent components of the local magnetic field, which includes AC contributions from proximal nuclear spins. In certain embodiments, the spin state is periodically modulated with k microwave (MW) π-pulses using modified XY8-k pulse sequence (where k is greater than 1 and is typically several hundred, the maximum number (1000's) is only limited by the coherence time of the NV center). The sequence is shown in FIG. 3, where MW indicates the pulse sequence of the external perturbation, which is in the microwave frequency range in the current example. The unit indicated by the dashed box is repeated. APD, which stands for avalanche photodiode, denotes the photodetector measurement window. The magnetic field created by target nuclear spins, containing several Fourier components, is shown in the lower trace in FIG. 3. When the local magnetic field spectrum contains a Fourier component near half the modulation frequency, the NV spin state accumulates a net phase (resulting in a measurable population signal) while components at other frequencies are efficiently cancelled. A measurable variance signal (proportional to the square of the magnetic field) can be obtained with a final π/2 pulse, which can be measured using spin-dependent fluorescence under optical pumping. A sweep of the modulation frequency yields the NQR spectrum, where the typical frequency range is 0.1 to 10 Mhz.

While conventional NQR spectroscopy suffers from poor sensitivity due to low thermal polarization under small magnetic field, the current embodiment of the method relies on measuring the statistical fluctuations of the spin polarization (proportional to $\sqrt{N}$, where N is the number of nuclear spins in the sensing volume), which is independent of the applied field. In the limit of small N, the statistical polarization can be much larger than the thermal polarization, resulting in fractional polarizations as high as $\sim 10^{-1}$. In addition, measurement of the magnetic field variance overcomes the issue of spin quenching which afflicts conventional NQR of species with integer spin number. The method allows for the measurement of the transition frequencies and relaxation/decoherence rates, which in turn can be related to various material properties (i.e. lattice constant, strain, piezoelectric properties).

Figure 4A:
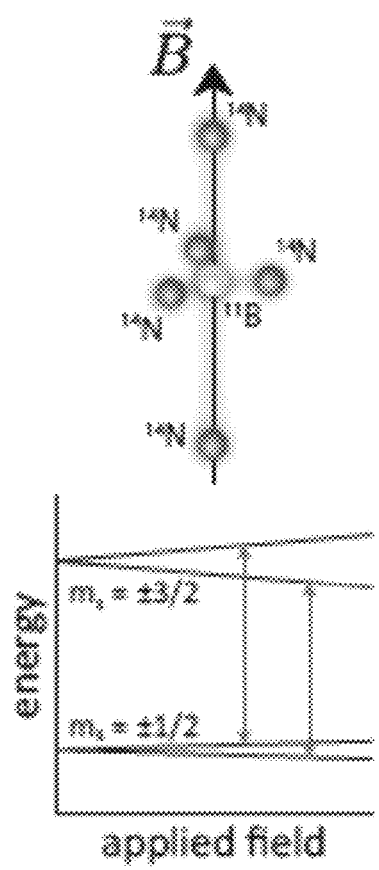
FIGS. 4A-4C are illustrations showing the dependence of the level structure of a quadrupolar nuclear spin on the directionality of a small applied magnetic field. The three configurations shown correspond to a spin-3/2 object where the external magnetic field is applied parallel (FIG. 4A), at a 54.7-degree angle (FIG. 4B) and perpendicular (FIG. 4C) to the principal axis. Arrows show the central transitions.
Figure 4B:
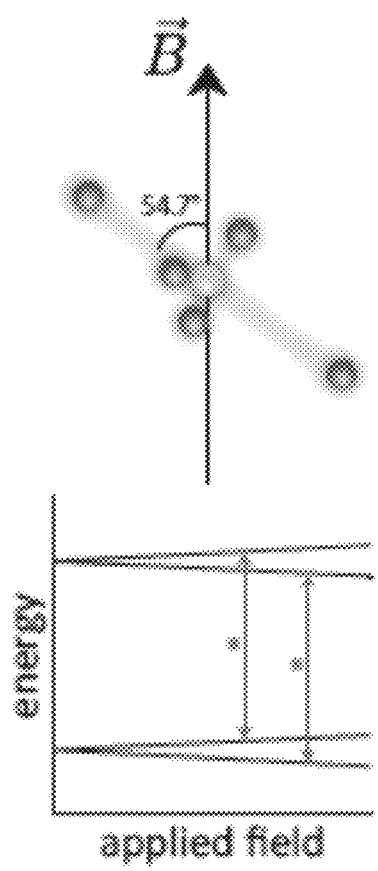
Figure 4C:
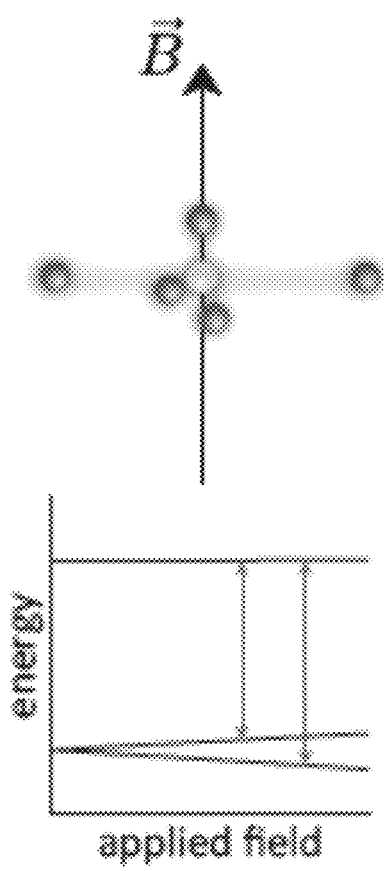
Figure 5A:
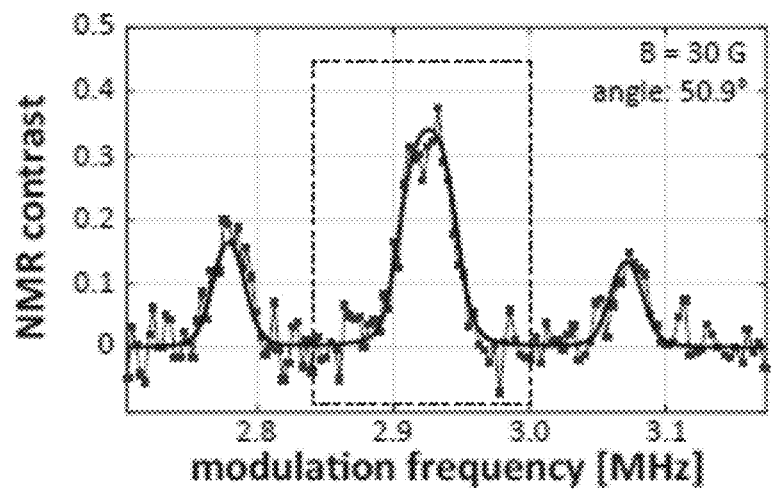
FIG. 5A is an $^{11}B$ NQR spectrum of multi-layer h-BN flakes using a XY8-371 frequency modulation with magnetic field (30 G) aligned (approximately) to the angle at which the central transitions become nearly degenerate (50.9°).

FIG. 5A shows the $^{11}B$ (I=3/2) NQR spectrum of a ~30 nm thick h-BN flake, measured using an XY8-371 sequence. The external magnetic field (~30 G) is applied parallel to the NV symmetry axis, which forms a 54.7-degree angle with the surface normal (as shown in FIG. 4B). The NMR contrast corresponds to the fluorescence difference of the $m_s=0$ and $m_s=1$ magnetic sublevels of the NV center. The experimental data (as well as all subsequent spectra presented in this work) are fit to a theoretical model consisting of the local magnetic spectral density convolved with the detector filter function. The resonance frequencies are determined by the quadrupole coupling constant $\overline{Q}$ which is the product of the scalar nuclear electric quadrupole moment and the largest eigenvalue of the local electric field gradient (EFG) tensor. The extracted $\overline{Q}=2.9221\pm0.0006$ MHz is in excellent agreement with values measured in macroscopic NQR experiments (2.96±0.1 MHz). The effective sensing volume is determined by the depth of the NV center (6.8±0.1 nm) and corresponds to approximately 20 atomic layers of h-BN material. In this configuration, the frequencies of the central transitions ($|m_I=\pm\frac{1}{2}\rangle \rightarrow |\pm\frac{3}{2}\rangle$) are degenerate whereas the satellite peaks, corresponding to dipole forbidden $|\mp\frac{1}{2}\rangle \rightarrow |\pm\frac{3}{2}\rangle$ transitions, become weakly allowed due to mixing by the magnetic field component perpendicular to the h-BN principal axis.

Figure 5B:
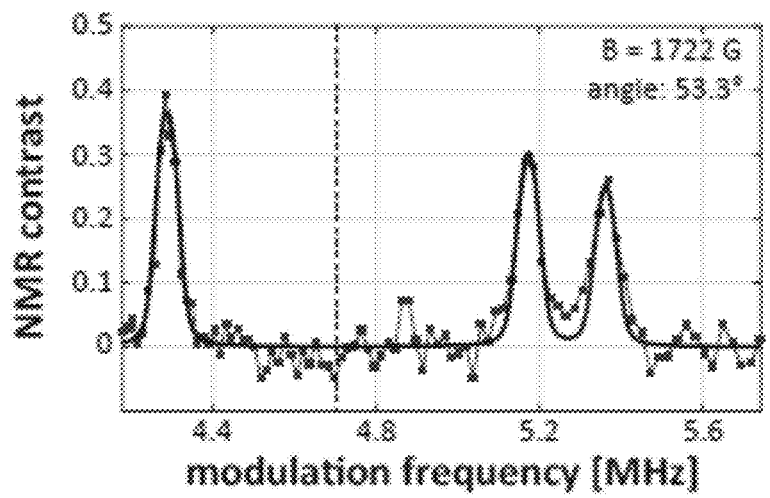
FIGS. 5B and 5C are spectra of $^{11}$B using XY8-251 at ~1700 G taken at two different angles of the magnetic field. Here the Larmor frequency is indicated by the vertical dashed lines (53.3° and 59.1°, respectively).
Figure 5C:
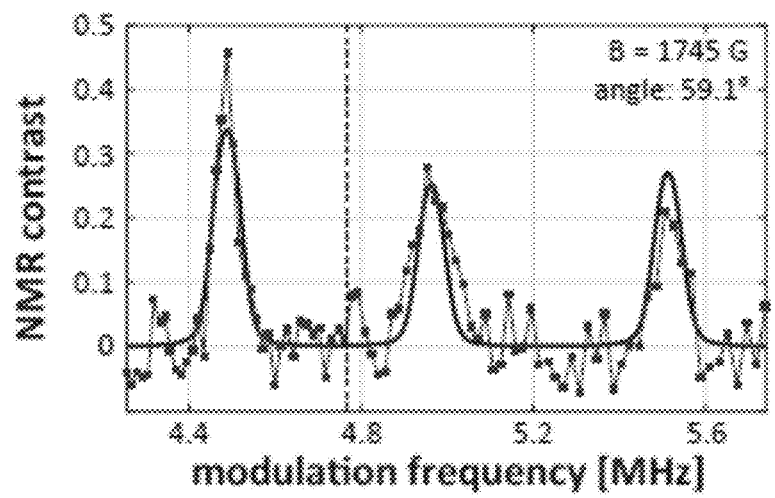
Figure 6A:
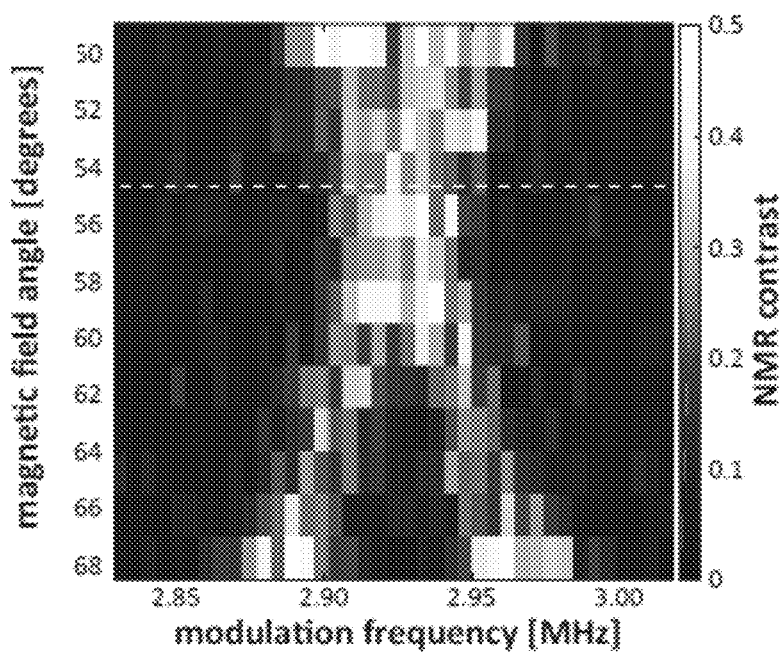
FIG. 6A illustrates the dependence of the spectrum at 30 G shown in FIG. 5A on the magnetic field angle.
Figure 6B:
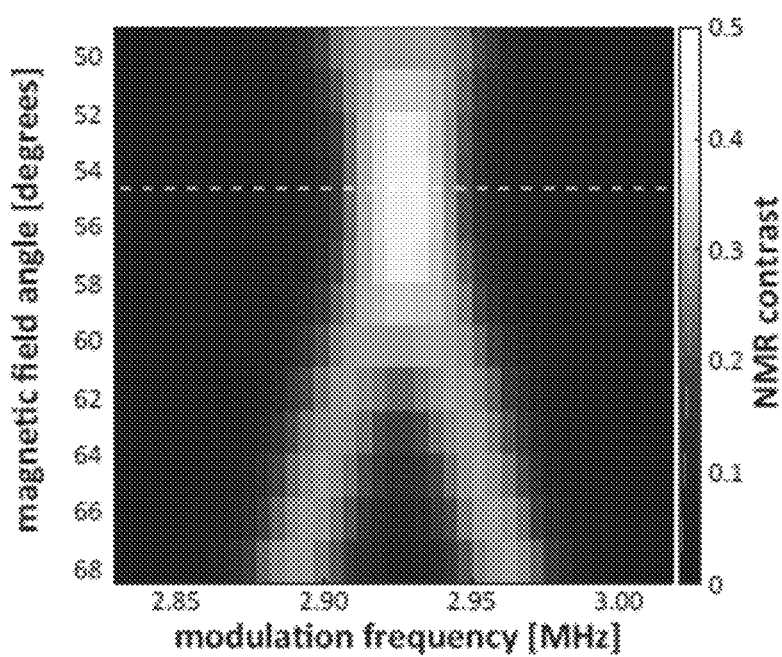
FIG. 6B is a simulation of magnetic field angle dependence shown in FIG. 6A.

The dependence of the NQR spectrum on magnetic field angle is also demonstrated. FIG. 6A shows a spectrum measured in the region denoted by the dotted rectangle in FIG. 5A. The angle at which the central transitions are degenerate is indicated by horizontal dashed line. As shown in FIG. 6A, rotation of the polar angle of the magnetic field away from the NV axis lifts the degeneracy of the central transitions, in excellent agreement with theoretical prediction (shown in FIG. 6B). FIGS. 5B and 5C show that when the magnetic field is increased so that the Zeeman and quadrupolar interactions are of the same order, the NQR spectrum becomes very sensitive to the magnetic field angle (sensitivity is ~80 kHz/degree at ~1700 G), enabling precise measurement of the h-BN crystal orientation (in this case perpendicular to the interface). In the case of a crystal of unknown orientation and quadrupole coupling constant or asymmetry parameter, the spectrum is measured over a wide range of magnetic field orientations and compared to a theoretical model.

Figure 7:
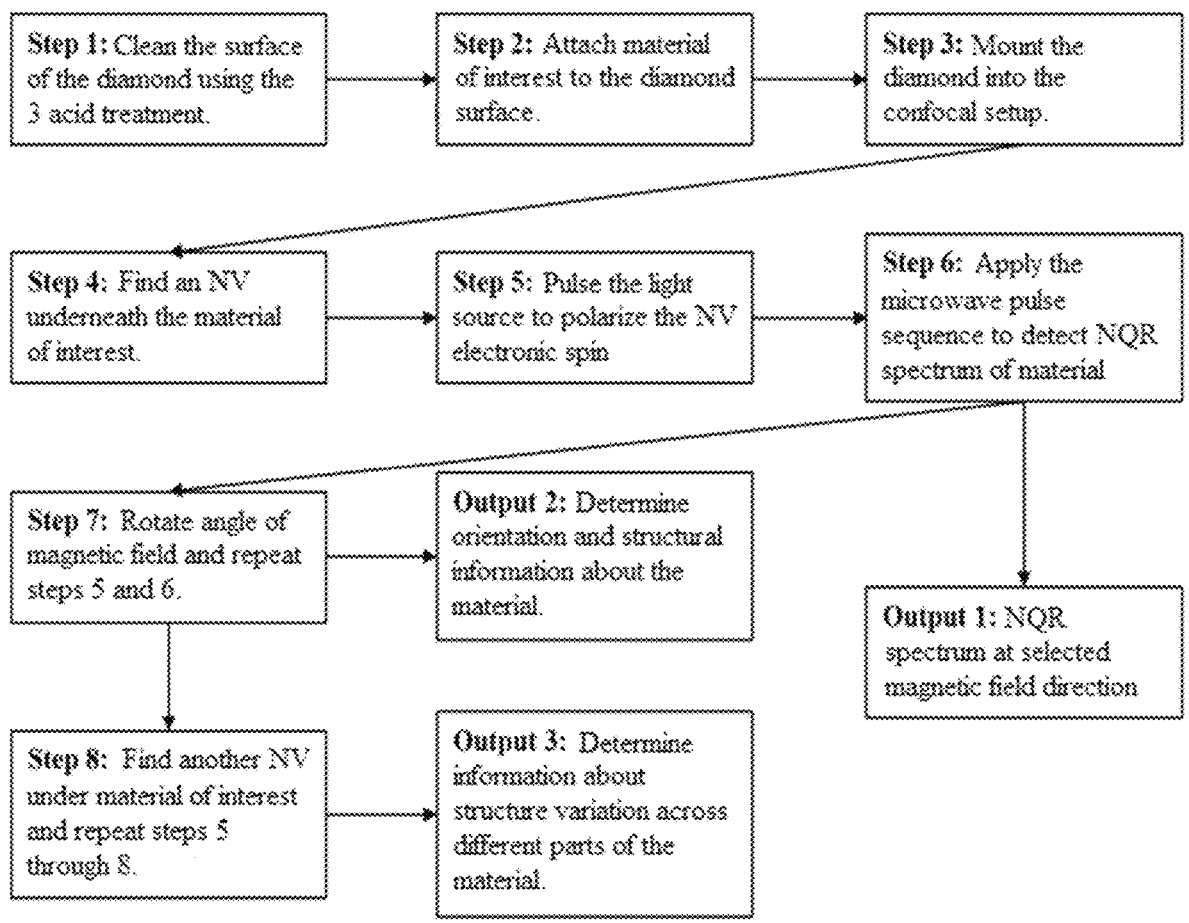
FIG. 7 is a flow diagram illustrating the steps of the nuclear quadrupole resonance (NQR) spectroscopic analysis of a two-dimensional material according to one or more embodiments.

FIG. 7 is a flow chart of steps required for analysis of a target material using the method and system according to one or more embodiments. Step 1 comprises of cleaning the surface of the diamond 102. In some embodiments, this is achieved using a 3-acid treatment described elsewhere in this specification. This is followed by Step 2 where a nanoscale target material that provides an ensemble of nuclear spins proximal to the NV center (e.g., approximately 30 nuclear spins) is placed on the surface of the diamond 102. In Step 3, the diamond is mounted in a confocal microscope, and the microscope is used to locate NV centers in the diamond for interrogation. A single NV center can be selected, although it is possible to practice the method using multiple NV centers. Use of multiple NV centers may result in lower sensitivity.

In Step 4, a static magnetic field is applied to the NV center. In one embodiment, the magnetic field is aligned with the axis of symmetry of the NV center. As is discussed in detail below, the magnetic field can be aligned at any angle, e.g., at an angle rotated away from the axis of symmetry of the NV center.

Step 5 is then carried out where in the light source 115 is used to generate light 105 to align, e.g., polarize, the electronic spin of the NV center. The light can be pulsed light and is selected to provide a polarized electronic spin at the start of a single measurement. This can be accomplished by focusing light, e.g., pulsed laser light, at a single NV center.

In Step 6, the external perturbation 106 from the first external perturbation source 116 is applied. The external perturbation includes a series of RF energy pulses at a selected modulation frequency. The light source 115 is pulsed to focus light 105 on the perturbed system to measure the fluorescence of the NV center after each external perturbation at a specific modulation frequency. The measured fluorescence of the NV electronic spin over a range of modulation frequencies is used to generate output 1—an NQR spectrum of the selected ensemble of nuclear spins at the selected magnetic field direction over a frequency range of relevance. The initial NQR spectrum provides information about local electric field gradients at the nuclei of the sample under an initial set of conditions.

In Step 7, the magnetic field is rotated relative to the sample to cause changes in the measured spectrum and Steps 5 and 6 are repeated. In some embodiments, the magnetic field strength of the applied magnetic field is in a range to provide Zeeman and quadrupole interactions of the same order, which has been found to provide increased sensitivity to the magnetic field angle. Because nuclear quadrupole splittings are typically in a frequency range of 0.1-10 Mhz, a magnetic field strength of approximately 100-2000 Gauss will cause a Zeeman splitting comparable to the quadrupolar splitting, depending on the nuclear species. In some embodiments, the pulsing sequence of the external perturbation 107 from the external perturbation source 117 in Step 7 is different from the previous pulse sequences of external perturbation 107 used in Step 6. This would be done to change the parameters such as frequency range or resolution of the measured spectrum, or to measure interactions of the nuclear spin with its surrounding nuclear spins. In some embodiments, the pulsing sequence of the second external perturbation 107 from the external perturbation source 117 in Step 7 is the same as the previous pulse sequences of external perturbation 107 used in Step 6. The treatment in Step 7, results in Output 2—a second NQR spectrum of the ensemble of nuclei under the new test conditions. Comparison of Output 1 and Output 2 provides information regarding orientation and structure of the sample by fitting the spectrum to a theoretical model that accounts for nuclear interactions with external magnetic fields and local electric field gradients Subsequently, as Step 8, Steps 4 through 6 are repeated at a different NV center located proximate to a different ensemble of nuclei from the sample. In some embodiments, the pulsing sequence of the external perturbation 107 from the external perturbation source 117 in Step 8 is different from the previous pulse sequences used earlier. This would be done to change the parameters such as frequency range or resolution of the measured spectrum, or to measure interactions of the nuclear spin with its surrounding nuclear spins. In some embodiments, the pulsing sequence of the external perturbation 107 from the external perturbation source 117 in Step 8 is the same as the previous pulse sequences used earlier. The treatment in Step 8 results in Output 3—a third NQR spectrum of the ensemble of nuclei under the new test conditions. Comparison of Output 1 and Output 3 provides information about structural variation across different regions of the sample by fitting the spectrum to a theoretical model at each region and comparing their differences and similarities.

Using Outputs 1, 2 and 3, changes in electrostatic and magnetic environments in the material can be used to gain a greater understanding of the structure and orientation of two-dimensional materials.

Figure 8A:
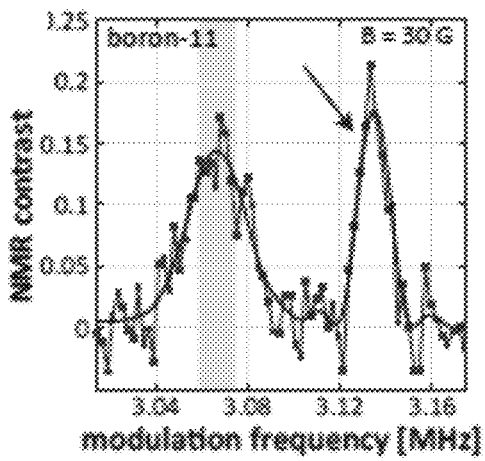
FIGS. 8A-8C are NQR spectra used to determine linewidth and quadrupole coupling constants of $^{11}$B, $^{10}$B and $^{14}$N for h-BN, respectively.
Figure 8B:
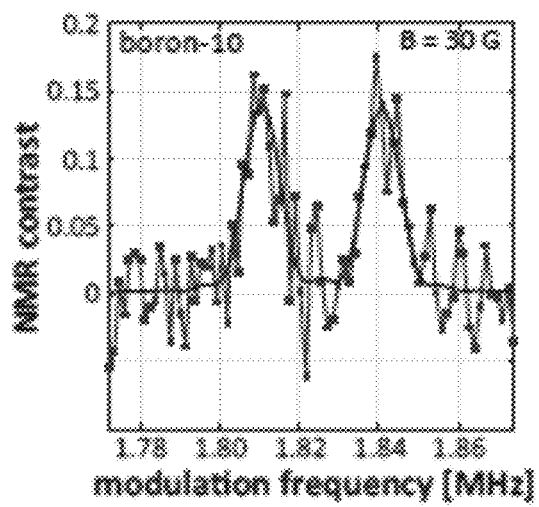
Figure 8C:
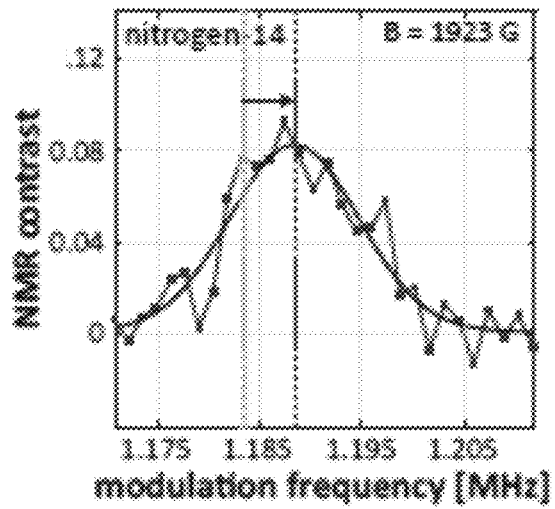
Figure 9:
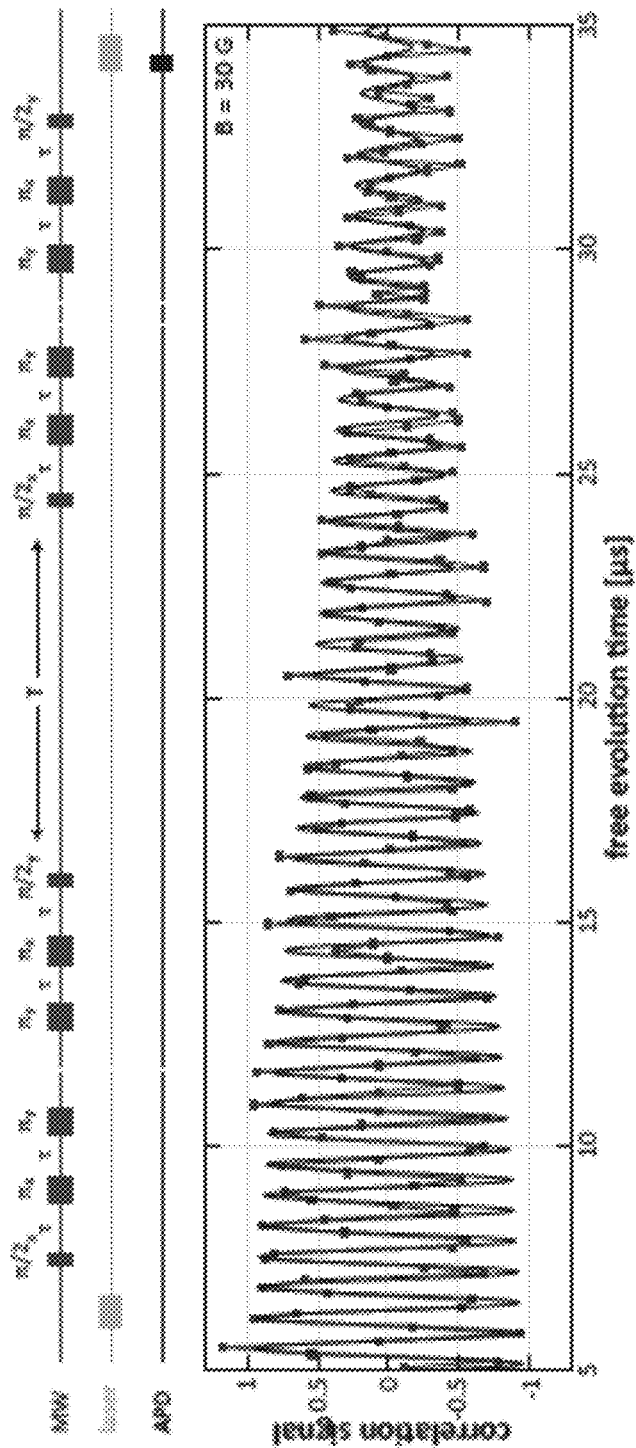
FIG. 9 is the pulse sequence for the time-domain measurement of linewidth and quadrupole coupling constant (top) and the output for $^{11}$B (bottom), where data is plotted against a simulated Gaussian decay curve.

Measurement of the spectral shifts and linewidths under different test conditions sheds light on the dynamics and interactions governing the nuclear spins. FIG. 8A shows the $|+\frac{1}{2}\rangle \to |-\frac{3}{2}\rangle$ $^{11}$B NQR resonance alongside an externally applied calibration signal (indicated by the arrow) whose width corresponds to the Fourier limit, determined by the spin coherence time $T_2$ of the NV sensor. Deconvolution of this calibration signal from the $^{11}$B resonance gives the natural NQR linewidth. A similar procedure yields the linewidth of $^{10}$B (I=3) where the observed doublet (FIG. 8B) corresponds to two sets of triply degenerate transitions. FIG. 8C shows the $^{14}$N spectrum measured at ~2000 G, where the quadrupolar interaction is manifested as a small shift from the nuclear Larmor frequency. The resonance frequencies and decoherence of NQR lines can also be measured directly (without deconvolution) in the time domain using correlation spectroscopy, illustrated in FIG. 9 (top). Here two identical pulse sequences (similar to XY8-k) are applied, separated by a variable free evolution interval T, which can be longer than the coherence time $T_2$ of the NV sensor and is limited only by the NV population relaxation time $T_1$. As a result, this technique yields improved spectral resolution at the expense of sensitivity (due to the additional free precession interval T). FIG. 9 (bottom) shows the resulting $^{11}$B time evolution, where the envelope (consistent with the linewidth measured in FIG. 8A, here modeled using a Gaussian decay) is modulated by fast oscillations (corresponding to $\overline{Q}$).

Figure 10:
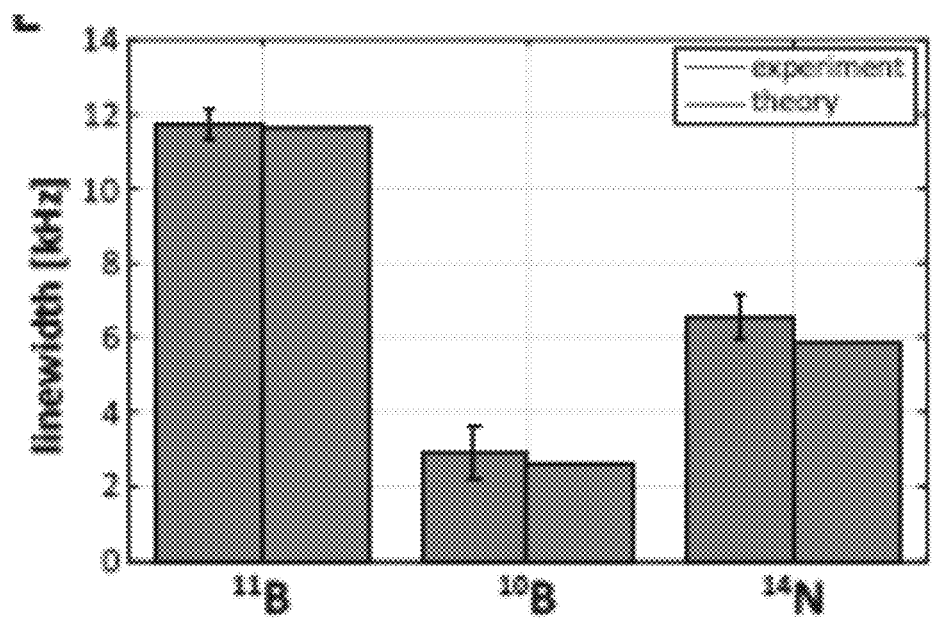
FIG. 10 is a bar graph of measured line widths (left) in FIGS. 8A-8C of $^{11}$B, $^{10}$B and $^{14}$N and corresponding simulated values based on dipolar interactions between the hBN nuclei (right). Error bars are 1-sigma uncertainties.
Figure 11:
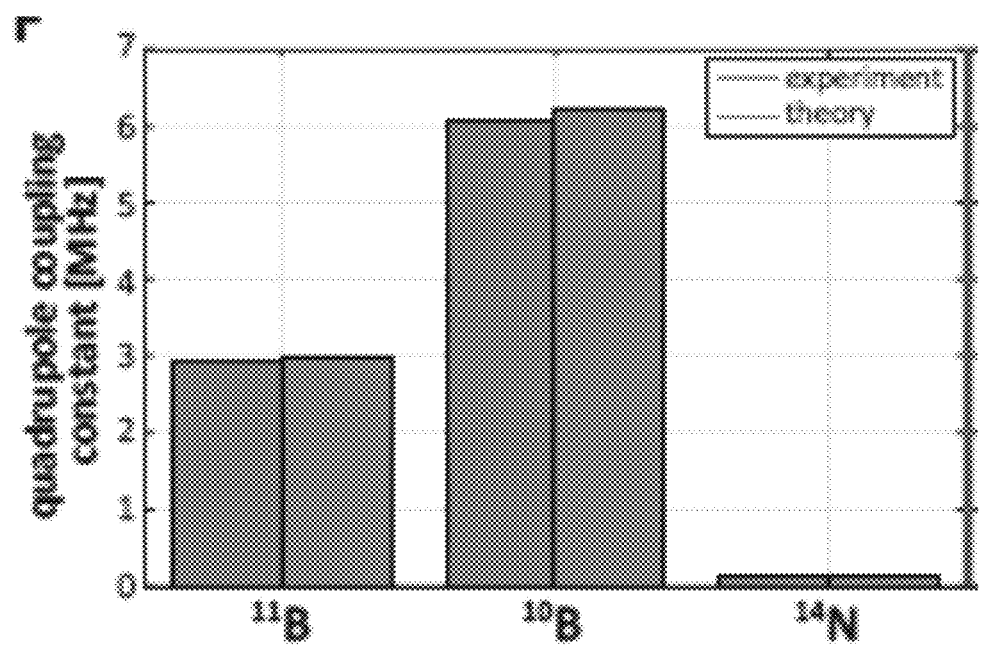
FIG. 11 is a bar graph of quadrupole coupling constants measured for $^{11}$B, $^{10}$B and $^{14}$N (left) and corresponding simulated values based on density functional theory (DFT) (right). The 1-sigma errors corresponding to $^{11}$B, $^{10}$B and $^{14}$N are 370 Hz, 1.4 kHz and 5.9 kHz, respectively and are too small to be visualized on the scale of this plot.

FIG. 10 shows the measured $^{11}$B, $^{10}$B and $^{14}$N linewidths (left hand bars) and the corresponding simulated linewidths (right hand bars). It is assumed that the spins interact only via magnetic dipole-dipole coupling. The simulated values are in excellent agreement with measurements reported here, demonstrating that nanoscale volumes of h-BN constitute nearly ideal, dipolar-coupled spin systems. FIG. 11 shows the measured values of $\overline{Q}$ for $^{11}$B, $^{10}$B and $^{14}$N (left hand bars), along with calculated values (right hand bars) based on density functional theory (DFT) simulations. Here an all-electron model in the local density approximation (LDA) was used, which yields the calculated quadrupole coupling constants within 2% of the measured values.

Figure 12:
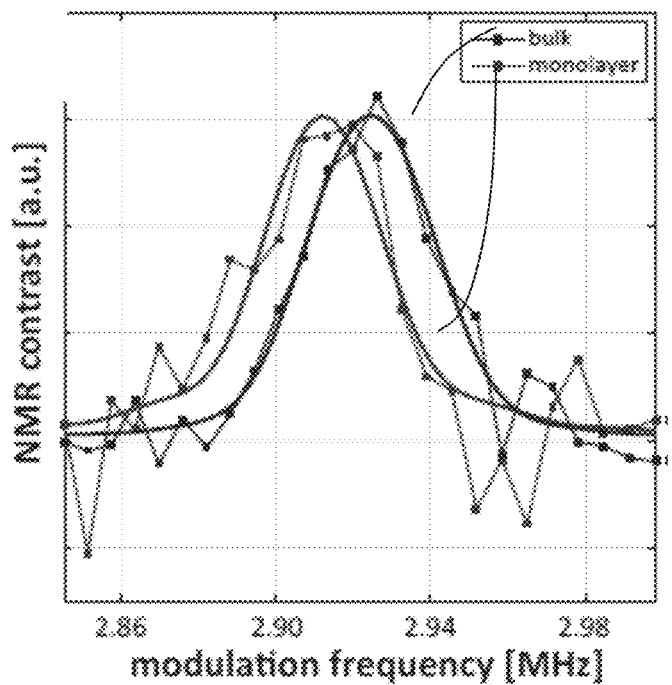
FIG. 12 illustrates the NQR spectroscopy of an h-BN monolayer and bilayer and shows an $^{11}$N NQR spectrum using XY8-187 pulse sequence for a thick (greater than 50 nm) h-BN flake (blue) as compared to a monolayer (red). Magnetic field is aligned with respect to NV symmetry axis and spectra have been normalized so that the resonances have the same magnitude, for comparison.
Figure 13:
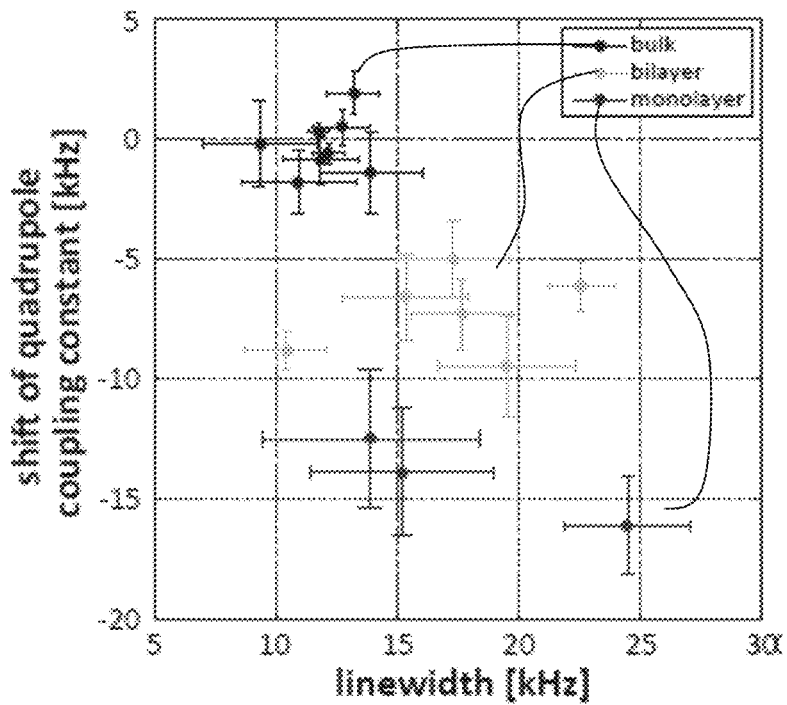
FIG. 13 is a plot illustrating the values of the shift of $\overline{Q}$ and deconvolved linewidths for several NV centers under a monolayer flake (red), a bilayer flake (green) and five bulk flakes (blue). Error bars correspond to 1-sigma uncertainties.

The measurement system is sufficiently sensitive to distinguish among monolayer, bilayer and bulk samples of h-BN. FIG. 12 shows the $^{11}$B NQR spectrum of a h-BN monolayer as compared to that of a thick (>50 nm) flake. The monolayer was characterized using Raman spectroscopy, atomic force microscopy (AFM) and second harmonic generation microscopy. This monolayer signal corresponds to approximately 30 polarized $^{11}$B spins and exhibits a 17±3 kHz shift of $\overline{Q}$ relative to the bulk value. FIG. 13 shows the shifts of $\overline{Q}$ and the corresponding linewidths for measurements for several NV centers under a monolayer flake (bottom) and a bilayer flake (middle), as compared to measurements on several thick layers (top). The bilayer shifts are in between the monolayer and bulk values and the signals for all the NV centers in both the monolayer and bilayer configurations shift in a consistent manner. The intensity of the signal can be fit to a theoretical model to determine the number of layers if the depth of the NV center is known by previously measuring its depth using a reference sample.

The origin of the $\overline{Q}$ shifts can be understood qualitatively by considering the reduction of the dimensionality of the h-BN crystal. As the number of layers in the crystal is reduced, the electric field gradient experienced by a nuclear spin will deviate from its bulk value.

In order to study this effect quantitatively, we performed DFT simulations of the EFG in the monolayer, bilayer, and bulk configurations. These simulations show that reducing the number of layers in the crystal shifts $\overline{Q}$ to lower frequencies. The calculated shifts (−15 kHz for bilayer; −25 kHz for monolayer) are approximately 50% larger than the measured values, but are well within the accuracy expected for DFT calculation of $\overline{Q}$ (as can be seen from the 80 kHz discrepancy between the measured and calculated values of $\overline{Q}$ in FIG. 11). DFT calculations show that the contribution to the EFG shift resulting from the removal of the outer layers (and their associated charges) accounts for only ~20% of the shift. The dominant contribution arises from a partial redistribution of the electron density (at the level of $10^{-4}$ of an elementary charge) from its bulk configuration (see FIG. 14) into a pair of negative charge "caps" above and below boron in the monolayer configuration (FIG. 15). The additional broadening observed in some of the monolayer and bilayer spectra is likely due to dipolar interactions with proximal 1H spins contained within the polycarbonate stamp as well as in the ubiquitous proton layer at the diamond surface, associated with adsorbed adventitious hydrocarbons. Note that in addition to changes in the electrostatic and magnetic environment due to the reduction in layers, differences in lattice strain between the bulk and 2D configurations may also contribute to shifts and broadening.

Although the applications apparent to one skilled in the art are innumerable, a non-limiting set of example applications characterizing nanoscale materials such as 2d materials or single proteins. Other applications include new quantum hybrid systems, combining atom-like systems coherently coupled with individual atoms in 2D materials.

These observations provide new insight into the local properties of two-dimensional materials. The sensitivity and spectral resolution can be improved by employing spin-to charge conversion readout and advanced photonic structures for improved collection efficiency. With these improvements, individual $^{11}$B spins can be detected within one second of integration time. The use of correlation spectroscopy provides a way of extending the sensing time beyond the coherence time of the NV center. Combined with advanced nuclear decoupling pulse sequences and modest cooling of the diamond samples to ~100 K, this method can be used to improve the spectral resolution by more than four orders of magnitude, down to ~1 Hz level. Scanning diamond tips or optical super-resolution techniques can be used for nanoscale imaging of local strain fields, localized defects, piezoelectric properties, and crystallinity in nanoscale materials. In other applications, the system can be chemically functionalized and incorporated into novel applications involving biosensing and composite materials.

In addition to providing a new sensing modality, the method and system described herein can be used to observe and coherently control dynamics of individual nuclear spins in 2D materials. In particular, arrays of NV centers can be used as actuators to coherently control nuclear spins in 2D materials. The nuclear spins can be individually addressed either directly via dipole-dipole coupling with a proximal NV center or using unpaired electronic spins on the diamond surface. Nuclear spin polarization and single spin control can be achieved by selectively pumping individual quanta of polarization from the NV center to the desired nuclear spin via Hartmann-Hahn Double Resonance, while interactions among nuclear spins can be engineered via pulsed RF control. Nuclear dynamics in 2D materials can be limited by dipole-dipole interactions (the additional broadening observed in some of our measurements can likely be controlled by removing proton spins from the diamond surface). Such a coherently coupled system can be used as a novel hybrid platform for quantum information processing and for studying quantum dynamics of isolated strongly interacting nuclear spin systems.

Theoretical Model of NQR Spectrum

Application of the modified XY8-k pulse sequence with free evolution interval τ leads to a population signal of the form $S(\tau) = \frac{1}{2}(1 - \cos \phi)$, where $\phi$ is the total accumulated phase at the end of the pulse sequence. Averaging over many realizations of the experiment and assuming that the accumulated phase is Gaussian-distributed with zero mean, the signal becomes $$S(\tau) = \frac{1}{2}(1 - e^{-\langle\phi^2\rangle/2}) \tag{1}$$

Here the phase variance $\langle\phi^2\rangle$ is given by (16)

$$\langle\phi^2\rangle = \frac{\gamma_e^2}{2\pi} \int_{-\infty}^{\infty} d\omega S_B(\omega) |g(\omega\tau)|^2, \tag{2}$$

where $\gamma_e$ is the electron gyromagnetic ratio, $S_B(\omega)$ is the double-sided magnetic spectral density and $|\omega\tau|^2$ is the detector filter function. For the modified XY8-k sequence, the filter function is given by $$|g(\omega\tau)|^2 = 2\sin^2\left(\frac{(k+1)\omega\tau}{2}\right)\tan^2\left(\frac{\omega\tau}{2}\right), \tag{3}$$

where evolution during the spin rotations is neglected. The spectral density for a uniform spin distribution of thickness h is given by the expression $$S_B(\omega) = 9\rho\left(\frac{\mu_0 \hbar \gamma_n}{4\pi}\right)^2 (\tilde{\Gamma}_x f^{x,x}(\omega) + \tilde{\Gamma}_y f^{y,y}(\omega)), \tag{4}$$

where $\rho$ is the spin density, $\mu_0$ is the vacuum permeability, h is the reduced Planck's constant and $\gamma_n$ is the gyromagnetic ratio of the target nuclear spin species. The geometrical factors $\tilde{\Gamma}_x$ and $\tilde{\Gamma}_y$ depend on the NV depth d and the angle of the NV symmetry axis relative to the surface normal and are given by the expressions $$\tilde{\Gamma}_x(\alpha) = -\frac{\pi}{3}\left(\frac{3\cos(4\alpha) - 35}{768}\right)\left[\frac{1}{d^3} - \frac{1}{(d+h)^3}\right] \tag{5}$$

$$\tilde{\Gamma}_y(\alpha) = \frac{\pi}{3}\left(\frac{3\cos(2\alpha) + 5}{192}\right)\left[\frac{1}{d^3} - \frac{1}{(d+h)^3}\right]. \tag{6}$$

For the special case of a [100]-oriented diamond, where the NV symmetry axis makes a ~54.7° angle relative to the surface normal, these expressions reduce to $$\tilde{\Gamma}_z = \frac{7\pi}{432}\left[\frac{1}{d^3} - \frac{1}{(d+h)^3}\right] \tag{7}$$

$$\tilde{\Gamma}_y = \frac{\pi}{144}\left[\frac{1}{d^3} - \frac{1}{(d+h)^3}\right]. \tag{8}$$

The transverse correlation functions $f^{x,x}$ and $f^{y,y}$ are given by $$f^{x,x}(\omega) = \frac{2}{Tr(1)} \sum_{n,m} |\langle n_z|I_x|m_z\rangle|^2 \delta(\Delta\omega_{n,m} - \omega) \tag{9}$$

$$f^{y,y}(\omega) = \frac{2}{Tr(1)} \sum_{n,m} |\langle n_z|I_y|m_z\rangle|^2 \delta(\Delta\omega_{n,m} - \omega), \tag{10}$$

where Tr(1) denotes the trace of the identity operator for the target nuclear spin, $I = \{I_x; I_y; I_z\}$ are the generalized spin matrices, and the indices n and m correspond to the complete set of spin eigenstates of the nuclear spin where the energy difference of the states is given by $\omega_{n,m}$. Note that each pair of eigenstates corresponds to two spectral lines, one at a positive and one at a negative frequency. Diagonalization of the nuclear Hamiltonian $$H_Q = \frac{\bar{Q}}{4I(2I-1)}[3I_z^2 - I^2 + \eta(I_x^2 - I_y^2)] + \hbar\gamma_n I \cdot B, \quad (11)$$

where B is the external applied magnetic field, yields a set of energy eigenvalues and eigenstates which can be used to evaluate the correlation functions in Eqs. 9 and 10 above. The quantity η, is known as the asymmetry parameter and is related to the degree of deviation from axial symmetry in a material (for the case of h-BN, η=0). In the absence of an applied magnetic field the eigenstates of $H_Q$ define a principal axis coordinate system. In axially symmetric materials, this coordinate system is parametrized by a single axis.

In the preceding analysis, we have implicitly assumed that the nuclear spins are noninteracting. In order to (approximately) capture the effects of interactions we replace the delta-function resonances in the magnetic spectral density with Gaussian functions of width γ:

$$\delta(\Delta\omega_{n,m} - \omega) \to \frac{1}{\sqrt{2\pi\gamma^2}} \exp\left[\frac{-(\omega - \Delta\omega_{n,m})^2}{2\gamma^2}\right]. \quad (12)$$

All NQR spectra presented in this work are evaluated using this model. After normalization, the data are fit using the expression in Eq. 1, where the fit parameters correspond to the depth of the NV sensor d, the applied external magnetic field, the quadrupole coupling constant of the target nuclear spins and the spectral linewidth γ.

NV Sensing Area and Volume

For a two-dimensional distribution of nuclear spins on the diamond surface, the amplitude of the magnetic field variance signal depends on the depth d of the proximal NV sensor. In the limit when d is much larger than the typical distance between the target nuclear spins (so that the sample can be considered a continuous spin density) approximately 75% of the NQR signal comes from within a circular region of area $\pi d^2$ on the diamond surface, directly above the NV center. In this work, we define this region to be the sensing area.

For a three-dimensional spin density, a similar analysis shows that approximately 50% of the signal comes from a half-sphere of volume $\frac{2}{3}\pi d^3$ on the diamond surface, directly above the NV center. We define this region to be the sensing volume.

Number of Detectable Spins

The optimal sensitivity yields the minimum number of detectable spins per unit averaging time $$N_{min} \approx \frac{16\pi^4 d^6}{(\mu_g \hbar \gamma_e \gamma_n)^2 \mathcal{F}} \frac{\sqrt{T_2 + T_R}}{T_2^Q}, \quad (13)$$

where we assume that the spins are situated on the diamond surface immediately above the NV sensor. Here $T_R$ corresponds to the readout time and F is the readout fidelity. Taking a typical readout fidelity of 0.03, a separation of 4 nm between NV and h-BN flake and the measured corresponding NV coherence time (~150 μs), we estimate that a single 11B nuclear spin can be detected in approximately one minute of integration time.

It has been demonstrated that with the use of spin-to-charge conversion readout, F can be dramatically increased at the cost of a modest increase in $T_R$. Using this technique, we estimate that sensitivity can be improved to allow detection of an individual [11]B spin, placed directly above the NV sensor, after one second of integration time. In this estimate we again assume a coherence time of 150 μs and an NV depth of 4 nm.

Model of Dipolar Interactions

Our model for simulating the nuclear spin linewidths, as presented in FIG. 10, assumes that the spins within the h-BN crystal ([11]B, [10]B and $^{14}$N) interact only via dipole-dipole coupling. We first consider the case of two nuclear spins. We first consider the simple case in which the NV sensor is used to probe a single nuclear spin (henceforth denoted by subscript 1) while it is being subjected to the magnetic field corresponding to fluctuations of a nearby nuclear spin (denoted by subscript 2). These magnetic fluctuations increase the linewidth of the spin being probed, where the linewidth is given by the root-meansquare (RMS) lineshift and corresponds to the expression $$\Delta\nu = \sqrt{\langle \delta_{m_1 n_1}^2 \rangle} = \sqrt{Tr(\rho_2 \delta_{m_1 n_1}^2)}, \quad (14)$$

where $\rho_2$ is the density operator corresponding to the spin that creates the magnetic fluctuations and $\delta_{m_1 n_1}^2$ is the lineshift variance, given by the expression $$\delta_{m_1 n_1}^2 = [(m_1|H_{int}|m_1) - (n_1|H_{int}|n_1)]^2/(2\pi\hbar)^2. \quad (15)$$

Here $|m_1\rangle$ and $|n_1\rangle$ are the spin eigenstates (determined by diagonalizing $H_Q$) corresponding to the transition being probed and $H_{int}$ is the dipole-dipole interaction Hamiltonian $$H_{int} = -\frac{\mu_0 \hbar^3 \gamma_{n,1} \gamma_{n,2}}{4\pi|r|^3}[3(I_1 \cdot r_{12})(I_2 \cdot r_{12}) - I_1 \cdot I_2] \quad (16)$$

$$= \frac{\mu_0 \hbar^3 \gamma_{n,1} \gamma_{n,2}}{4\pi|r|^3}[I_1^x B_x + I_1^y B_y + I_1^z B_z], \quad (17)$$

where the magnetic field operators are defined by the expressions $$B_x = I_2^x - 3(r_{12} \cdot \hat{x})[(r_{12} \cdot \hat{x})I_2^x + (r_{12} \cdot \hat{y})I_2^y + (r_{12} \cdot \hat{z})I_2^z] \quad (18)$$

$$B_y = I_2^y - 3(r_{12} \cdot \hat{y})[(r_{12} \cdot \hat{x})I_2^x + (r_{12} \cdot \hat{y})I_2^y + (r_{12} \cdot \hat{z})I_2^z] \quad (19)$$

$$B_z = I_2^z - 3(r_{12} \cdot \hat{z})[(r_{12} \cdot \hat{x})I_2^x + (r_{12} \cdot \hat{y})I_2^y + (r_{12} \cdot \hat{z})I_2^z]. \quad (20)$$

Here $\gamma_{n,1}$ and $\gamma_{n,2}$ are the gyromagnetic ratios of the nuclear spins, $r_{12}$ is the separation vector between the two spins and $\hat{x}, \hat{y}, \hat{z}$ are unit vectors corresponding to the chosen coordinate system.

When more than two spins are included in the analysis the lineshift variances corresponding to each spin can be added independently, resulting in the total linewidth $$\Delta\nu = \sqrt{\sum_i Tr(\rho_i \delta_{m_1 n_1}^2)}. \quad (21)$$

All measurements presented in this work are performed at room temperature, where the spin eigenstates can be assumed to be equally populated. Consequently, the density operator of all spins corresponds to a fully unpolarized mixture of spin eigenstates.

The following additional experimental details are provided, which are intended to be illustrative and art not intended to be limiting of the invention.

1 Diamond Samples

All measurements reported in this work were performed using three (henceforth referred to as samples A, B, and C) [100]-cut, electronic-grade diamond crystals (Element Six). The samples consisted of a 50 μm $^{12}$C-enriched (99.999% abundance, epitaxially-grown using plasma-enhanced chemical vapor deposition) layer on a natural-abundance diamond substrate. The isotopically-enriched surfaces of samples A and C were polished while sample B was left unpolished. Substitutional N and B concentrations were less than 5 and 1 ppb, respectively. Samples A, B and C were implanted (Innovion) with a $^{15}$N$^+$ dose of $10^9$ cm$^{-2}$, tilt angle of 0° and ion beam energies of 3 keV, 2 keV and 3 keV, respectively.

After implantation the samples were cleaned in a boiling mixture (1:1:1) of nitric, sulfuric and perchloric acids. The diamonds were then annealed in vacuum using the following procedure: (a) 6-hour ramp to 400° C., (b) 6 hours at 400° C., (c) 6-hour ramp to 800° C., (d) 8 hours at 800° C. and (e) 6-hour ramp to room temperature. After a second 3-acid clean, the samples were annealed in a dry oxygen environment (Tystar, Mini Tytan 4600) using the following procedure: (a) ramp to 465° C. for 2 hours, (b) anneal at 465° C. for 4 hours, (e) ramp down to 250° C. for 2 hours. The samples were cleaned in a Piranha solution (2:1 mixture of concentrated H2SO4 and 30% hydrogen peroxide) immediately before and after the oxygen anneal. This treatment reduced the decoherence rates of near-surface NV centers

2 Hexagonal Boron Nitride Samples

Hexagonal boron nitride flakes were produced by mechanical exfoliation of single crystals grown by a high-pressure and high-temperature process. The flakes were first exfoliated using wafer tape (Ultron Systems 1007R) onto a Si substrate with 90 nm of thermally grown $SiO_2$ (NOVA Wafer). This thickness of $SiO_2$ on Si was used to maximize the optical contrast of monolayer h-BN flakes. To remove tape residue from the exfoliation process, the chip was vacuum annealed for 30 minutes at 300° C. in a rapid thermal annealer. Thin flakes were identified using an optical microscope and then characterized by atomic force microscopy, Raman spectroscopy, and optical measurements of second harmonic generation (see section on identifying h-BN layer thickness). The thin flakes of h-BN were transferred from the Si/$SiO_2$ chip onto a diamond chip with implanted NV centers by the same dry polymer transfer process used to create van der Waals heterostructures. First, h-BN flakes were peeled off from the $SiO_2$ surface by sequentially pressing a polymer stamp made of polycarbonate to the surface of the chip, heating to 90° C., cooling to room temperature, and peeling off the stamp. The picked-up flakes on the polymer stamp were then brought in contact with the diamond surface while heating to 160° C., causing the polymer stamp and the h-BN flakes to adhere to the diamond surface. We did not remove the polycarbonate layer using annealing, since shallow NV centers are susceptible to degradation if exposed to the type of vacuum annealing commonly used by the 2D material community. When the h-BN flakes are transferred onto the diamond surface, they become weakly fluorescent and can be colocalized with shallow NV centers. The h-BN fluorescence can then be readily photobleached by applying a 532 nm laser for several seconds.

3 Optical Setup

All NMR and NQR experiments were carried out using a scanning confocal microscope. Optical excitation of individual NV centers was performed using a 532 nm laser (Coherent, Compass 315M-100) while the NV fluorescence was detected with a fiber-coupled single-photon counting module (PerkinElmer, SPCMAQRH-14-FC). The microscope used a Nikon Plan Fluor 100× oil immersion objective (NA=1:3) in an inverted configuration. Lateral steering of the laser beam was accomplished using a galvanometer (Thorlabs GVS012) while the vertical position was controlled with a piezoelectric stage (Physik Instrumente P-721 PIFOC). Pulses of laser light were gated using an acousto-optic modulator, which was controlled through TTL pulses delivered using a pulse generator (Spincore Technologies 500 MHz PulseBlasterESR-PRO).

4 Microwave Setup

Microwave (MW) drive fields were applied to the NV sensor using a Stanford Research Systems SG384 signal generator. Here the phase of the waveform is modulated using a built-in IQ modulator, which is triggered using a two-output Tektronix 3052C Arbitrary Function Generator (AFG). The MW pulses are gated with a Mini-Circuits switch (ZASWA-2-50DR+), which is controlled using a second Tektronix 3052C AFG. The gated signal is amplified using a Mini-Circuits ZHL-16W-43-S+ amplifier and delivered to the NV center via a coplanar waveguide. The coplanar wave guide included layers of Ti (50 nm), Cu (1000 nm) and Au (300 nm) on a glass coverslip (Ted-Pella, Inc, #260320). A transmission line pattern is created using photolithography (SUSS MicroTec MJB4) where the exposed metal is removed using Au etch (Cu and Au) and dilute hydrofluoric acid (Ti).

5 Modified XY8-k Pulse Sequence

All NQR measurements presented utilized a modified XY8-k pulse sequence. Here the NV electronic spin state is optically polarized and prepared in a superposition of the magnetic sublevels $m_s=0$ and $m_s=1$. The state is then periodically flipped with k π-pulses, applied at frequency f (not to be confused with the carrier frequency of the MW field, which is close to the NV zero-field splitting of ~2.87 GHz (39)). The spin evolution during the control sequence is governed by the time-dependent components of the local magnetic field (which may include contributions from proximal nuclear spins). Any accumulated phase at the end of the control sequence can be converted to a measurable population signal with a final π/2 pulse and measured via spin-dependent fluorescence under optical pumping. In contrast to the more established XY8 sequence, in which the free evolution intervals immediately after the initial π/2-pulse and immediately before the final π/2-pulse are half as long as those between subsequent π-pulses, the k+2 pulses comprising the sequence are separated by identical free evolution intervals. The amplitudes of the π and π/2 pulses are controlled through IQ modulation. The phases of the pulses are applied using the following pattern:

$$[X]_1[Y]_2[X]_3[Y]_y[Y]_5[X]_6[Y]_y[X]_8 \ldots [X]_{k-2}[Y]_{k-1}[X]_{k_1} \quad (22)$$

where [X] and [Y] correspond to rotations about the x and y axis, respectively. In order to cancel the DC component of the magnetic noise spectrum, an odd number of π-pulses is required. As a specific example, an XY8-11 sequence has the form $$[X]_{\pi/2}[X]_\pi[Y]_\pi[X]_\pi[Y]_\pi[Y]_\pi[X]_\pi[Y]_\pi[X]_\pi[X]_\pi[Y]_\pi[X]_\pi [X]_{\pi/2}, \quad (23)$$

where each pulse is separated by free evolution interval τ. The modulation frequency is defined as the inverse of this free evolution interval, so that f=1/τ.

6 NV Magnetic Sensitivity

The optimal magnetic sensitivity, defined as the minimum variance signal $\delta B^2_{min}$ detectable in time t, is achieved when the total sequence duration is approximately equal to the spin coherence time $T_2$ of the NV sensor and is given by the expression $$\delta B_{min}^2 \sqrt{t} \approx \frac{\pi^2}{\gamma_e^2 \mathcal{F}} \frac{\sqrt{T_2 + T_R}}{T_2^Q}. \quad (24)$$

Here $T_R$ is the readout time (which is negligible for the conventional optical readout used in this work) and $F=[1+2(\alpha_0+\alpha_1)/(\alpha_0-\alpha_1)^2]^{<1/3}$ is the readout fidelity, where 0 and 1 are the average number of photons detected, per measurement, from the $m_s=0$ and $m_s=1$ spin sublevels of the NV center, respectively. For typical readout fidelities of ~0.03, the control sequence must be repeated many times (>1000) in order for the fluorescence of the $m_s=0$ and $m_s=1$ sublevels to be distinguished.

As can be seen from Eq. 3, the sensitivity depends strongly on the coherence time $T_2$, which in turn depends on the number of applied pulses k in the XY8-k sequence and the details of the interaction between the sensing qubit and its environment. In most cases of interest, the coherence time tends to increase with increasing k. As a specific example, for a Lorentzian noise bath in the limit of long correlation time the coherence time increases as $T_2 = T_2^{SE} k^{2/3}$, where $T_2^{SE}$ is the spin echo (single π-pulse) coherence time. In this case the optimal sensitivity becomes (neglecting $T_R$)

$$\delta B_{min}^2 \sqrt{t} \approx \frac{1}{(T_2^{SE})^{9/2} f^3}. \quad (25)$$

where $f-1/\tau$ is the modulation frequency. As can be seen from Eq. 4, the sensitivity becomes dramatically worse for low-frequency signals. This effect illustrates the reasoning behind detecting $^{14}$N at high magnetic field (see FIG. 8C). The intrinsic NV decoherence manifests itself as an additional exponential decay factor in the population signal:

7 Density Functional Theory Simulations

Historically, the nuclear quadrupole splitting was detected by experiments such as Mössbauer spectroscopy, and is caused by the coupling between the nuclear quadrupole moment and the local electric field gradient that arises from the nearby electronic charge density. Advances in understanding of this effect have been significantly aided by the development of first-principles density functional theory (DFT), a method for obtaining accurate electronic charge densities in the ground state. Excellent agreement between DFT results and experiment in what concerns the nuclear quadrupole splitting has been demonstrated for various materials, for example Fe. This is evidence that DFT describes accurately the electric field gradient, which depends sensitively on the electron density near the nucleus.

We employ an all-electron full-potential linearised augmented-plane wave (FP-LAPW) DFT calculation, implemented in the ELK code. The core states near the nucleus, included in this all-electron formalism, are crucial for accurate electric field gradient (EFG) tensor evaluations. The local density approximation (LDA) exchange-correlation functional is used with a reciprocal k-grid size of 13×13×5 for bulk h-BN and 13×13×1 for the bilayer and monolayer h-BN crystals. In the all-electron code, the wave function behaves differently near the atomic cores and in the interstitial space between the cores, which are divided by a muffin-tin radius $R_{MT}$=0:61 Å. The maximum angular momentum used for the augmented-plane wave is 10 and the plane wave basis for the interstitial region has a cutoff $8R_{MT}^{-1}$. We obtain the EFG tensor at the nuclear sites from the converged ground state electron density at the in-plane lattice constant determined by total-energy minimization.

We further investigate the effects of strain on the electric field gradient at the nucleus. We numerically calculate the response of the EFG to variations in the inter-layer spacing (FIG. 16A). Here the EFG approaches the monolayer value for spacing higher than ~5 Å. If the strain is assumed to be in-plane it can be described by the displacement field $\vec{u}=(u_x; u_y)$. Locally, the strain field is characterized by $u_{ii}=\partial_i u_i$ with i=x; y and $u_{xy}=\partial_x u_y + \partial_y u_x$. Assuming a slowly varying DC strain field in space, the changes in the local electric field gradient tensor at the nucleus can be expanded up to the linear leading order of $u_{ij}$ as:

$$M_{EFG} \approx M_{EFG}^0 + t_1(u_{xx}+u_{yy})M_1 + t_2[(u_{xx}-u_{yy})M_2 + u_{xy}M_3] \quad (27)$$

with unperturbed electric field gradient tensor $M_{EFG}^0 = \lambda_0 M_1$ and the 3×3 matrices $M_i$ whose form is constrained by the $D_{3h}$ group theory representation for the h-BN crystal:

$$M_1 = \begin{bmatrix} -1 & 0 & 0 \\ 0 & -1 & 0 \\ 0 & 0 & 2 \end{bmatrix}, M_2 = \begin{bmatrix} 1 & 0 & 0 \\ 0 & -1 & 0 \\ 0 & 0 & 0 \end{bmatrix}, M_3 = \begin{bmatrix} 0 & 1 & 0 \\ 1 & 0 & 0 \\ 0 & 0 & 0 \end{bmatrix}, \quad (28)$$

For the bulk h-BN crystal, the DFT estimates are: $\lambda_0$=−1519:5 V/nm$^2$, $t_1$=1210:5 V/nm$^2$ and $t_2$=−3921:1 V/nm$^2$ at in-plane lattice constant a=2:50 Å and c-axis 3:33 Å for the boron sites. In the case of in-plane isotropic strain, the lattice constant to a+δa with $u_{xx}=u_{yy}=\delta a/a$, $u_{xy}=0$, $\delta M_{EFG}=2t_1 M_1 \delta a/a$ which gives $\delta V_{zz}=4t_1 \delta a/a$ (see FIG. 16B). This dependence of the EFG on the in-plane lattice constant implies that lattice constant changes as small as ~50 femtometers (corresponding to 1 kHz shift in $\bar{Q}$) can be detected using our technique.

8 Point Charge Model of EFG Shift

In order to qualitatively understand the origin of the observed EFG shift in the monolayer and bilayer configurations we consider a simple toy model in which the in-plane sp$^2$ electrons are modeled as classical point charges at interstitial sites between the boron and nitrogen ions. In order to preserve charge neutrality we assign a charge of −8/3e to the valence electrons and +3e and +5e to the boron and nitrogen ions, respectively. Here e is the elementary charge. The EFG at the boron site is calculated by summing up the proximal point charges in the monolayer, bilayer and bulk configurations. We find that the fractional EFG shift (relative to bulk) is ~0:015% and ~0:03% in the bilayer and monolayer configurations, respectively.

9 Determination of h-BN Thickness

To identify monolayer and bilayer h-BN flakes we use three techniques: relative intensity of the h-BN Raman peak at 1366 cm$^{-1}$, relative intensity of second harmonic generation (SHG), and atomic force microscope (AFM) height measurements. First, thin flakes are identified in an optical microscope under white illumination, where candidate monolayer and bilayer flakes have the faintest optical contrast. To determine the specific number of layers in a flake, we measure the intensity of the characteristic h-BN Raman line near 1366 cm$^{-1}$, which scales with the layer thickness. FIG. 17A shows the background-subtracted Raman spectra for a series of flakes of different thicknesses. The spectra clearly separate into discrete groups and are differentiated by a well-defined intensity step. We find that the Raman signal intensity accurately identifies monolayer and bilayer flakes, while Raman frequency shifts varies sample to sample, possibly due to the variations in strain. We verify that the discrete intensity steps correspond to thickness changes of a single monolayer by AFM height measurements at step interfaces within the flakes (FIG. 17B). Given the regularity of the intensity change with layer number, we conclude that the flakes in the group with the smallest Raman intensity must be monolayers. As a final confirmation, we compare optical SHG for different numbers of layers. SHG should only occur in h-BN flakes with an odd number of layers due to a lack of inversion symmetry. FIG. 17C (bottom) shows the result of a SHG measurement (excitation with 880 nm light and collection at 440 nm), where the flake region identified by Raman spectroscopy to be a monolayer exhibits a strong SHG signal while the adjacent bilayer region shows no SHG signal.

10 Measurements of 1H NMR

It has been shown that diamond samples exposed to ambient laboratory conditions, even briefly, contain a 1 to 2 nm layer of adsorbed water or adventitious hydrocarbons on their surfaces. We use $^1$H NMR to probe this layer. As in our NQR experiments, a modified XY8-k pulse sequence (see above) is used to collect information about various Fourier components of the local magnetic noise spectrum. The magnetic field is aligned with the NV symmetry axis and the magnitude of the field is tuned such that the 1H resonance (which coincides with the Larmor frequency for a spin-1/2) is at some specified modulation frequency. Here the NV center is located under a h-BN bilayer and also exhibits a $^{11}$B NQR resonance. The data is fit to a model function, similar to that discussed above. Based on the depth of this NV center extracted from the $^{11}$B NQR spectrum (5.0±0.1 nm) (or more precisely, the distance of the NV center from the h-BN flake) the amplitude of the $^1$H signal is far larger than would be expected for a 1 nm layer of water or hydrocarbons. Indeed, in our experiments the h-BN flake is protected on the backside by a thick (greater than 1 μm) layer of Poly (Bisphenol A carbonate), containing 40 protons per nm$^3$. This large $^1$H signal (effectively from a proton halfspace) allows us an independent estimation of the NV depth. The depths extracted from $^1$H NMR are smaller than those extracted from $^{11}$B NQR by 1 to 2 nm. This result is in excellent agreement with literature values reported previously. In our estimation of the depth from the $^1$H signal, we assume that the proton density in the adsorbed surface layer is the same as that in the polycarbonate film. The presence of proximal proton spins on both sides of the h-BN flake also provides a possible mechanism for explaining the NQR line broadening observed in some monolayer and bilayer spectra (see. FIG. 13). Here we estimate the presence of a single $^1$H spin, separated from a $^{11}$B spin by 2 Å, would increase the linewidth to ~22 kHz. An additional mechanism that could potentially account for broadening of NQR lines is local strain, which would lead to an inhomogeneous distribution of $\overline{Q}$ and non-zero asymmetry parameters η. Surprisingly we found that while some NV centers under a monolayer h-BN flake were shallow enough (based on their 1H signal) to yield a NQR signal, they showed no obvious $^{11}$B signal. A possible explanation of this effect is hydrocarbon bubbles that have been shown to form under h-BN flakes. In this case, for some NV centers the flake is simply too far away to be detectable via NQR.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

The invention claimed is:

1. A method of characterizing nanoscale materials, comprising:
    (a) providing a sample having at least one nuclear spin I with a nonzero nuclear quadrupole moment in proximity to a sensor, wherein the sensor comprises at least one first solid state electronic spin qubit;
    (b) applying a magnetic field at a first angle to the sample;
    (c) applying light and a plurality of external spin perturbation sequences to the sensor to coherently manipulate the spin state of the spin qubit, wherein each of the external spin perturbation sequences filters for a selected magnetic field frequency produced by the nuclear spins; and
    (d) detecting an output signal given by the strength of the magnetic field at each selected frequency at a first position to provide a first nuclear quadrupole resonance (NQR) spectrum of the sample.

2. The method of claim 1, further comprising:
    (e) applying a magnetic field at a second angle to the sample; and
    (f) repeating said (c) applying light and a plurality of external spin perturbation sequences to the sensor to coherently manipulate the spin state of the spin qubit and said (d) detecting an output signal given by the strength of the magnetic field at each selected frequency at a second position to obtain a second nuclear quadrupole resonance spectrum of the sample, wherein fitting both the first and second nuclear quadrupole resonance spectra to a theoretical model provides orientation and/or structural information about the sample.

3. The method of claim 2, wherein said (e) and said (f) are carried out at multiple angles to further improve the accuracy of the theoretical fit which provides information on the structural information.

4. The method of claim 1, further comprising:
    (g) identifying a second solid state electronic spin qubit in proximity to the sample;
    (h) aligning the magnetic field to the second solid state electronic spin qubit; and
    (i) repeating said (c) applying light and a plurality of external spin perturbation sequences to the sensor to coherently manipulate the spin state of the spin qubit and said (d) detecting an output signal given by the strength of the magnetic field at each selected frequency to provide a first nuclear quadrupole resonance spectrum of the sample at the second solid state electronic spin qubit to obtain a third nuclear quadrupole resonance spectrum of the sample, wherein comparison of the first and third nuclear quadrupole resonance spectra provides information about structure variation across different regions of the sample.

5. The method of claim 1, wherein the solid state electronic spin qubit comprises a nitrogen vacancy center in a diamond crystal lattice.

6. The method of claim 1, wherein the at least one nuclear spin has I≥1.

7. The method of claim 1, wherein the plurality of external spin perturbation sequences uses a radio frequency (RF) electromagnetic field.

8. The method of claim 7, wherein the plurality of external spin perturbation sequences comprises k microwave π-pulses with a modulation frequency in the range of 0.1 to 10 MHz, where k is in the range of 1 to thousands, depending on a coherence time of the solid state electronic spin qubit.

9. The method of claim 1, wherein detecting the output signal is accomplished by measuring spin-dependent fluorescence.

10. The method of claim 1, wherein the applied magnetic field strength is selected so that a Zeeman and quadrupole interactions are of the same order of magnitude.

11. The method of claim 1, wherein the sample is at least one of a two dimensional material, a protein, a biological macromolecule.

12. The method of claim 1, wherein the selected magnetic field frequencies are in the range of 0.1 to 10 MHz.

13. The method of claim 1, wherein the first angle of the applied magnetic field is aligned with a symmetry axis of the solid state electronic spin qubit.

14. The method of claim 1, further comprising fitting the NQR spectrum to a pre-determined model of the atomic structure of the sample.

15. The method of claim 1, wherein at least one of a quadrupole coupling constant and a local electric field gradient is determined from fitting the NQR spectrum.

16. A system for measuring the nuclear spin interactions of a nanoscale material with nuclear quadrupole coupling, comprising:
   a sensor for receiving a nanoscale sample, wherein the sensor comprises at least one solid state electronic spin qubit;
   a magnetic field source capable of applying a magnetic field at more than one angle;
   a light source;
   an external spin perturbation source for providing a plurality of external spin perturbation sequences to the sensor, wherein the light source and external spin perturbation source are configured to coherently manipulate the spin state of the spin qubit, wherein each of the external spin perturbation sequences filters for a selected magnetic field frequency produced by the nuclear spins; and
   a detector for detecting an output signal given by the strength of the magnetic field at each selected frequency to provide a first nuclear quadrupole resonance spectrum of the sample.

17. The system of claim 16, wherein the sensor comprises a defect in a high purity diamond crystal lattice, and the defect comprises a nitrogen vacancy center in the diamond crystal lattice.

18. The system of claim 16, wherein the selected magnetic field frequencies are in the range of 0.1 to 10 MHz.

19. The system of claim 16, wherein the magnetic field source is selected to provide and applied magnetic field strength in the range of 1 to 2000 Gauss.

20. The system of claim 16, wherein the external spin perturbation source comprises a radio frequency (RF) electromagnetic field source.

* * * * *